United States Patent
Rossi

(10) Patent No.: US 10,734,366 B2
(45) Date of Patent: Aug. 4, 2020

(54) OPTO-ELECTRONIC MODULE FOR EMITTING LIGHT OF VARIABLE INTENSITY DISTRIBUTION

(71) Applicant: ams Sensors Singapore Pte. Ltd., Singapore (SG)

(72) Inventor: Markus Rossi, Jona (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/413,891

(22) PCT Filed: Jul. 9, 2013

(86) PCT No.: PCT/SG2013/000288
§ 371 (c)(1),
(2) Date: Jan. 9, 2015

(87) PCT Pub. No.: WO2014/014416
PCT Pub. Date: Jan. 23, 2014

(65) Prior Publication Data
US 2015/0155270 A1 Jun. 4, 2015

Related U.S. Application Data

(60) Provisional application No. 61/672,628, filed on Jul. 17, 2012.

(51) Int. Cl.
*H01L 25/075* (2006.01)
*H01L 25/00* (2006.01)
(Continued)

(52) U.S. Cl.
CPC ............ *H01L 25/0756* (2013.01); *F21V 5/04* (2013.01); *F21V 7/00* (2013.01); *F21V 14/04* (2013.01);
(Continued)

(58) Field of Classification Search
CPC ..... H01L 25/0756; H01L 25/50; H01L 33/58; H01L 31/0232; H01L 2924/12044;
(Continued)

(56) References Cited

U.S. PATENT DOCUMENTS 5,801,798 A * 9/1998 Chen ..................... G02F 1/29
349/202
5,912,872 A 6/1999 Feldman et al.
(Continued)

FOREIGN PATENT DOCUMENTS

JP 2009087785 A 4/2009
JP 2010-152100 7/2010
(Continued)

OTHER PUBLICATIONS

International Search Report issued in PCT/SG2013/000288 dated Oct. 23, 2013.
(Continued)

*Primary Examiner* — Marin Pichler
(74) *Attorney, Agent, or Firm* — Michael Best and Friedrich LLP

(57) ABSTRACT

The opto-electronic module comprises a first substrate member; a second substrate member; a first spacer member comprised in the first substrate member or comprised in the second substrate member or distinct from and located between these, which comprises at least one opening; a light emission element arranged on the first substrate member; a first passive optical component; at least one of the first and second substrate members comprising one or more transparent portions through which light can pass, the first passive optical component being comprised in or distinct from the one or more transparent portions, and wherein the first passive optical component has adjustable optical prop-
(Continued)

erties. Such modules are well mass-producible in high precision and can be used in photo cameras, e.g., as flashes.

35 Claims, 9 Drawing Sheets

(51) Int. Cl.
*F21V 14/04* (2006.01)
*F21V 14/06* (2006.01)
*F21V 5/04* (2006.01)
*F21V 7/00* (2006.01)
*G02B 7/02* (2006.01)
*G02B 19/00* (2006.01)
*H01L 33/58* (2010.01)
*H01L 31/0232* (2014.01)
*H01L 27/146* (2006.01)
*H01L 25/16* (2006.01)
*F21Y 115/30* (2016.01)
*F21Y 115/10* (2016.01)

(52) U.S. Cl.
CPC ............. *F21V 14/06* (2013.01); *G02B 7/021* (2013.01); *G02B 19/0014* (2013.01); *G02B 19/0061* (2013.01); *H01L 25/50* (2013.01); *H01L 31/02325* (2013.01); *H01L 33/58* (2013.01); *F21Y 2115/10* (2016.08); *F21Y 2115/30* (2016.08); *H01L 25/167* (2013.01); *H01L 27/14625* (2013.01); *H01L 2224/16* (2013.01); *H01L 2924/12044* (2013.01); *H01L 2924/1461* (2013.01)

(58) Field of Classification Search
CPC ......... H01L 2924/1461; H01L 2224/16; H01L 25/167; F21V 5/04; F21V 14/06; F21V 14/04; F21V 7/00; G02B 19/0014; G02B 19/0016; G02B 7/021; F21Y 2101/02; F21Y 2101/025; G02F 1/0018; G02F 1/03; G02F 1/29; G02F 1/292; G02F 1/31; G02F 1/133553; G02F 2001/294
USPC ................................ 359/315, 316, 318, 319
See application file for complete search history.

(56) References Cited

U.S. PATENT DOCUMENTS

| | | | |
|---|---|---|---|
| 6,833,938 B2 | 12/2004 | Nishioka | |
| 6,900,843 B1 | 5/2005 | Uchiyama | |
| 8,045,159 B2 | 10/2011 | Egloff et al. | |
| 2002/0141062 A1 | 10/2002 | Christoffersen et al. | |
| 2006/0132644 A1 | 6/2006 | Shangguan et al. | |
| 2007/0109489 A1* | 5/2007 | Nomura | G02F 1/133526 349/200 |
| 2007/0126912 A1 | 6/2007 | De Bruin et al. | |
| 2008/0136955 A1* | 6/2008 | Kathman | G02B 6/4231 348/340 |
| 2008/0218873 A1* | 9/2008 | Batchko | G02B 26/005 359/665 |
| 2009/0262346 A1* | 10/2009 | Egloff | G01J 3/02 356/326 |
| 2010/0259832 A1* | 10/2010 | Suijver | G02B 3/14 359/666 |
| 2011/0043923 A1 | 2/2011 | Rossi et al. | |
| 2011/0050979 A1 | 3/2011 | Rudmann | |
| 2011/0134304 A1 | 6/2011 | Vigier-Blanc et al. | |
| 2012/0081360 A1* | 4/2012 | Uehira | G01B 11/2513 345/419 |

FOREIGN PATENT DOCUMENTS

JP 2011244346 A 12/2011
WO 2005/083789 A2 9/2005

OTHER PUBLICATIONS

R. Adelsberger et al., "Spatially Adaptive Photographic Flash," ETH Zurich, Dept. of Computer Science, Technical Report No. 612 (2008).
Taiwanese Patent Office Search Report for related Application No. 102123624 dated Dec. 14, 2016 (3 pages including statement of relevance).

\* cited by examiner

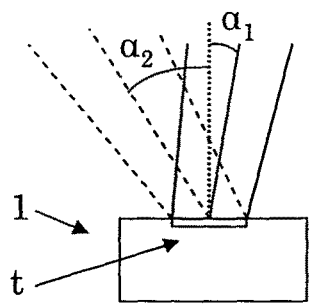
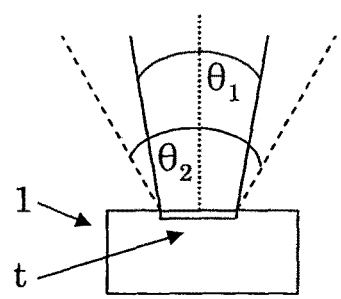
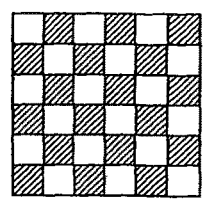
Fig. 20     Fig. 21     Fig. 28
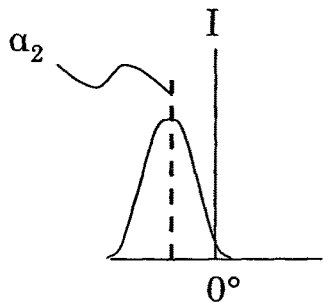
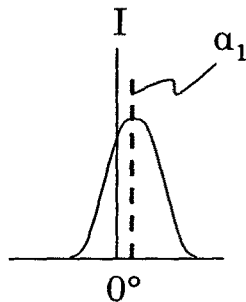
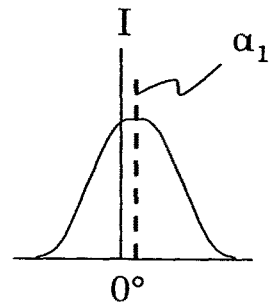
Fig. 22     Fig. 23     Fig. 24
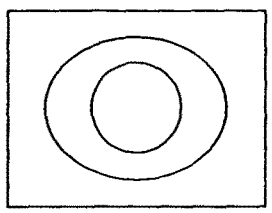
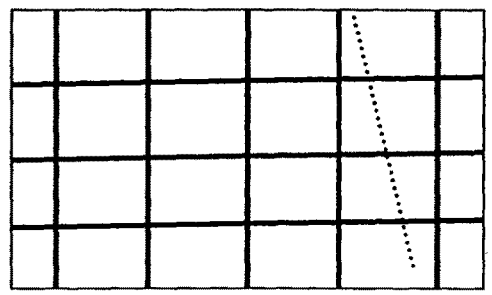
Fig. 26
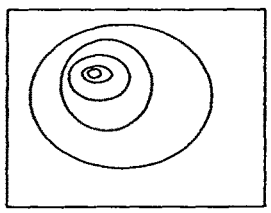
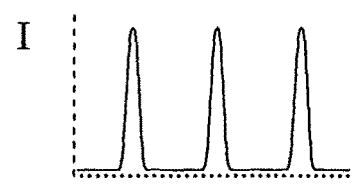
Fig. 27
Fig. 25

OPTO-ELECTRONIC MODULE FOR EMITTING LIGHT OF VARIABLE INTENSITY DISTRIBUTION

TECHNICAL FIELD

The invention relates to the filed of optics and more specifically to the field of micro-optics. It relates to opto-electronic modules and to methods of manufacturing the same and to appliances and devices comprising such modules, in particular wherein the modules comprise a light emitter. The invention relates to methods and apparatuses according to the opening clauses of the claims.

Definition of Terms

"Active optical component": A light sensing or a light emitting component. E.g., a photodiode, an image sensor, an LED, an OLED, a laser chip. An active optical component can be present as a bare die or in a package, i.e. as a packaged component.

"Passive optical component": An optical component redirecting light by refraction and/or diffraction and/or (internal and/or external) reflection such as a lens, a prism, a mirror, or an optical system, wherein an optical system is a collection of such optical components possibly also comprising mechanical elements such as aperture stops, image screens, holders. The term "passive" in "passive optical component" does not exclude the possibility to have electrically operated or actuated parts therein.

"Opto-electronic module": A component in which at least one active and at least one passive optical component is comprised.

"Replication": A technique by means of which a given structure or a negative thereof is reproduced. E.g., etching, embossing, imprinting, casting, molding.

"Wafer": A substantially disk- or plate-like shaped item, its extension in one direction (z-direction or vertical direction) is small with respect to its extension in the other two directions (x- and y-directions or lateral directions). Usually, on a (non-blank) wafer, a plurality of like structures or items are arranged or provided therein, typically on a rectangular grid. A wafer may have openings or holes, and a wafer may even be free of material in a predominant portion of its lateral area. A wafer may have any lateral shape, wherein round shapes and rectangular shapes are very common. Although in many contexts, a wafer is understood to be prevailingly made of a semiconductor material, in the present patent application, this is explicitely not a limitation.

Accordingly, a wafer may prevailingly be made of, e.g., a semiconductor material, a polymer material, a composite material comprising metals and polymers or polymers and glass materials. In particular, hardenable materials such as thermally or UV-curable polymers are interesting wafer materials in conjunction with the presented invention, but semiconductor materials, too.

"Lateral": cf. "Wafer"

"Vertical": cf. "Wafer"

"Light": Most generally electromagnetic radiation; more particularly electromagnetic radiation of the infrared, visible or ultraviolet portion of the electromagnetic spectrum.

SUMMARY OF THE INVENTION

One object of the invention is to create novel and useful opto-electronic modules and methods for manufacturing the same as well as appliances and devices comprising such modules, methods of manufacturing such devices and various uses of such modules.

Another object of the invention is to provide particularly miniscule opto-electronic modules.

Another object of the invention is to provide particularly versatile opto-electronic modules.

Another object of the invention is to provide particularly well mass-producible opto-electronic modules.

Another object of the invention is to provide advanced flash modules.

Further objects emerge from the description and embodiments below.

At least one of these objects is at least partially achieved by apparatuses and methods according to the patent claims.

The opto-electronic module comprises
 a first substrate member;
 a second substrate member;
 a first spacer member comprised in said first substrate member or comprised in said second substrate member or distinct from and located between these, which comprises at least one opening;
 a light emission element arranged on said first substrate member;
 a first passive optical component;
 at least one of said first and second substrate members comprising one or more transparent portions through which light can pass, said first passive optical component being comprised in or distinct from said one or more transparent portions, and wherein said first passive optical component has adjustable optical properties.

Such a module can in particular be a module for emitting light with a variable intensity distribution. More particularly, it is possible to provide that an intensity distribution of light emitted by the module, e.g., an intensity distribution over a solid angle, can be adjusted by adjusting said adjustable optical properties of said first passive optical component. For example, by selectively influencing portions of said first passive optical component, intensities in corresponding regions of the intensity distributions (such as solid angle portions into which light is emitted from the module) can be attenuated, or by adjusting said first passive optical component so as to selectively redirect portions of light incident said first passive optical component, intensities in regions of the intensity distributions (such as solid angle portions into which light is emitted from the module) can be attenuated or amplified (intensified).

Said adjustable optical properties are usually meant to be repeatedly adjustable optical properties.

Said adjustable optical properties can be (or comprise), e.g., a transmittivity or absorption or a reflectivity which can be selectively varied across an active surface of the first passive optical component. Or it can be (or comprise), e.g., refractive properties and/or a shape of a (reflective or transmissive) surface which can selectively varied.

One or both of the surface on which light can impinge so as to be (adjustably) influenced by the passive optical component and the surface at which light exits the first passive optical component after having been (adjustably) influenced by the passive optical component can be referred to as active surface.

Said one or more transparent portions are usually provided for allowing light originating from said light emission element to exit the module. It is possible to provide that light (usually originating from said light emission element) can propagate from inside the module to outside the module through any of said one or more transparent portions.

Said light emission element is an active optical component for emitting light. The emitted light can, e.g., be (visible) white light, which can be useful when the module shall be used in photographic flash applications. But it can also be infrared light, e.g., if the module shall be used for producing (invisible) patterns on a scene, e.g., when distance measurements shall be accomplished in which such a pattern applied to a scene is analyzed for estimating a distance between the module and various portions of the scene.

If said first spacer member is comprised in said first substrate member, it is usually located at a side of said first substrate member facing said second substrate member.

If said first spacer member is comprised in said second substrate member, it is usually located at a side of said second substrate member facing said first substrate member.

Said light emission element is usually arranged on a face of said first substrate member facing said second substrate member.

It is usually provided that said light emission element is electrically connected to said first substrate member. And it is furthermore possible to provide that said light emission element is, via said first substrate member, electrically connected to outside of the module. This way, said light emission element can be provided with electric power from outside the module.

It can be provided that said first passive optical component is arranged at said first substrate member (e.g., thereon or therein), but it can also be provided (usually alternatively) that said first passive optical component is arranged at said second substrate member (e.g., thereon or therein).

In one embodiment, the module comprises a second passive optical component, in particular wherein said second passive optical component is a lens or lens element. Said second passive optical component can be a diffractive and/or a refractive passive optical component. Said second passive optical component can be a transparent optical structure such as a lens or a prism, but it can also be a reflective element such as a planar or a curved (e.g., parabolic) mirror. More complex or optically improved optical setups may be achievable this way.

In one embodiment referring to the before-addressed embodiment, said second passive optical component is at least one of at least substantially made of a hardened hardenable material and obtained using a replication process. In particular, embossing may be used in manufacturing the second passive optical component. It can be particularly efficient, if said one of the substrate members is manufactured, in the same process, together with said second passive optical component. In this particular case, also the respective member is at least substantially made of a hardened hardenable material and/or obtained using a replication process.

In one embodiment which may be combined with the before-addressed embodiment, said light emission element, said one or more transparent portions and said first passive optical component are mutually arranged such that light emitted from said light emission element can propagate along a light path interconnecting said light emission element, said first passive optical component and said one or more transparent portions, and exit the module through said one or more transparent portions. (Note that it is possible that said first passive optical component is comprised in a transparent portion.)

If said second passive optical component is present, it is usually also arranged on said light path, in particular along said light path between said light emission element and said first passive optical component, but it can also be arranged along said light path between said first passive optical component and said one or more transparent portions (and it can be comprised in the latter). Said light path may, in particular, be located within the module.

In one embodiment which may be combined with one or more of the before-addressed embodiments, said first passive optical component is structured and configured for allowing to adjust an intensity distribution of light originating from said light emission element exiting the module by adjusting said adjustable optical properties. Thus, if light is emitted by said light emission element, an intensity distribution the light has after interacting with said first passive optical component and after having left the module (usually through one or more of said transparent portions) is adjustable (or selectable) by adjusting said adjustable optical properties of the first passive optical component.

Said intensity distribution of light having exited the module can be, e.g., a light intensity distribution as detectable on a screen (such as a white paper or a silver screen or a detector screen) on which light having exited the module impinges.

In one possible application, said adjustable optical properties can be used for achieving an adjustable angular range (adjustable in, e.g., width and/or angular position) illuminated by light originating from said light emission element having exited the module through said one or more transparent portions, e.g., a solid angle illuminated by light originating from said light emission element having exited the module through said one or more transparent portions and having an intensity of, e.g., at least 5% of a maximum intensity of said light can be adjusted by suitably adjusting said first passive optical component.

In another possible application, said adjustable optical properties can be used for achieving an adjustable main emission direction and/or an adjustable central emission direction for light originating from said light emission element having exited the module through said one or more transparent portions. This can be useful for flash or illumination applications in photography, or for illumination applications in still photography or filming or videoing. But it can also be useful for scanning one or more light beams across a scene, e.g., for creating illumination patterns on a scene which again can be useful in photography.

Under a "main emission direction" we understand that direction in which the maximum light intensity is emitted. Under a "central emission direction" we understand the mean direction resulting from a weighted averaging of a directional emission characteristic.

In one possible application, said adjustable optical properties can be used for emitting light forming a light pattern, more precisely, for emitting light having an intensity distribution representing a light pattern. It is thus possible to create an illumination describing a pattern or to illuminate a scene with a light pattern. A light pattern is to be understood to have several (at least two) intensity rises and drops (which usually would be considered steep rises or drops) or to have several (at least two) light intensity peaks (which usually would be considered sharp peaks), more precisely, one can define that a light intensity distribution of a light pattern has, along a straight line through the light intensity distribution, an intensity profile along said straight line showing at least two local maxima separated by a local minimum, wherein the intensity at said local minimum is at most 10% (or rather at most 5%) of the intensity at any of said local maxima. In conjunction with the described module, one could say that there exists a straight line in a plane parallel to a plane described by said first substrate member (x-y-plane, lateral plane), and an intensity profile along said straight line for light originating from said light emission element having exited the module through said one or more transparent portions has at least two local maxima separated by a local minimum, the intensity at said local minimum being at most 10% (or rather at most 5%) of the intensity at any of said local maxima. Light patterns often comprise repetitive shapes in the light intensity distribution, such as a number of like lines or patches of a least approximately equal intensity, wherein such shapes usually repeat at least twice and rather at least three or even at least four times. Typically, a light pattern comprises several typically straight lines, in particular crossed lines, or like polygons of least approximately equal intensity, typically evenly distributed in the light intensity distribution, e.g., like squares of a checkerboard.

In one embodiment which may be combined with one or more of the before-addressed embodiments, said first passive optical component comprises a provision for adjusting said adjustable optical properties.

In one embodiment which may be combined with one or more of the before-addressed embodiments, said adjustable optical properties are adjustable by applying a signal, in particular an electrical signal such as a voltage, to said first passive optical component.

In one embodiment which may be combined with one or more of the before-addressed embodiments, said first passive optical component comprises a control input, wherein said adjustable optical properties are adjustable by applying an electrical signal to said control input. Said electrical signal can be, e.g., a voltage.

In one embodiment which may be combined with one or more of the before-addressed embodiments, said first passive optical component is electrically connected to said first substrate member. If the first passive optical component has a control input as mentioned above, this control input may be electrically connected to said first substrate member.

In one embodiment which may be combined with one or more of the before-addressed embodiments, said first passive optical component comprises an actuator. It can be provided that said adjustable optical properties are adjustable by means of said actuator.

It can in particular be provided that said actuator is electrically operable.

Actuators may be, e.g., electrodes, piezo-electric elements, micro-mechanical drives, comb actuators.

In one embodiment which may be combined with one or more of the before-addressed embodiments, said first passive optical component is at least one of a reflective passive optical component and a transmissive passive optical component. Mirror-like first passive optical components are reflective passive optical components, e.g., deformable mirrors or micro-mirror arrays or diffraction gratings with adjustable grating constant. Transmissive passive optical components are usually transparent (or at least comprise a transparent region or portion), e.g., deformable lenses (liquid or solid), adjustable shades.

In particular, one can say that light originating from said light emission element and exiting the module through said one or more transparent portions
  has passed (traversed) said first passive optical component in case it is a transmissive passive optical component; and
  has been reflected by said first passive optical component in case it is a reflective passive optical component.

In one embodiment which may be combined with one or more of the before-addressed embodiments, said optical properties are adjustable by at least one of
  deforming at least one constituent of said first passive optical component; and
  rearranging at least one constituent of said first passive optical component.

Said deforming may comprise one or more of stretching, shrinking, bending said at least one constituent. This can be the case, e.g., for solid deformable lenses and for deformable diffraction gratings.

Said rearranging may comprise one or more of tiliting, rotating, translating said at least one constituent. This can be the case, e.g., for lenses formed by liquids, for passive optical components featuring liquid crystals and for mirrors of a micro-mirror array.

It can in particular be provided that said optical properties are adjustable by rearranging and/or deforming a multitude of constituents of said first passive optical component.

In one embodiment which may be combined with one or more of the before-addressed embodiments, said optical properties are adjustable by rearranging a multitude of constituents of said first passive optical component, wherein said multitude of constituents are
  a multitude of micro-mirrors; or
  a multitude of molecules or atoms.
Said micro-mirrors may, e.g., be tilted.
Said multitude of molecules or atoms can be, e.g.,
  electroactive polymer molecules; or
  liquid crystals;
  molecules or atoms of at least two different fluids forming an interface which alters its shape, e.g., upon application of an electric field.

At least in the two last-mentioned cases, the respective atoms or molecules are usually comprised in a housing, and typically, they are fully enclosed by said housing. Such a housing usually is structured and arranged for allowing light to pass across it.

In many cases, said rearranging of multiple constituents is a mutual or relative rearranging of the respective constituents, such as atoms or molecules or micro-mirrors being moved or tilted with respect to each other.

In one embodiment which may be combined with one or more of the before-addressed embodiments, said optical properties are adjustable by at least one of
  deforming a lens element comprised in said first passive optical component;
  deforming a diffraction grating comprised in said first passive optical component;
  deforming a mirror or mirror element comprised in said first passive optical component;
  deforming a reflective membrane comprised in said first passive optical component.

In one embodiment which may be combined with one or more of the before-addressed embodiments, said adjustable optical properties are differently adjustable for at least one of
  light incident on the first passive optical component in different locations;
  light incident on the first passive optical component in different angles of incidence.

In one embodiment which may be combined with one or more of the before-addressed embodiments, said first passive optical component has an active area, and wherein said adjustable optical properties comprise at least one of a transparency and a reflectivity which is adjustable to different values in different regions of said active area. Said active area can be, e.g., an area on which light originating from said light emission member is incident which later on will exit the module after having been influenced by the first passive optical component; such a variable or adjustable shade can in particular be structured and configured such that its transparency is differently adjustable for different regions across the shade, e.g, transparency can be increased stronger in a first region than in a second region or can be increased in a first region while being decreased in a second region. Or, the first passive optical component may comprise a mirror of adjustably different reflectivity in different locations across the mirror.

A first passive optical component comprising a shade of adjustably different transparency in different locations across the shade may be realized, e.g., by means of liquid crystals.

In one embodiment which may be combined with one or more of the before-addressed embodiments, said first passive optical component is structured and configured for redirecting light incident on the first passive optical component along different incidence directions to different exit directions, in particular wherein at least for one of
- light incident on the passive optical component in different angles of incidence;
- light incident on the passive optical component in different locations;
- an exit direction can be adjustably different.

It is possible to provide that a direction of redirecting light incident on the passive optical component is differently adjustable for light incident on the passive optical component from different directions and/or for light incident on the passive optical component in different locations. Thus, it can become possible to steer beams and/or to create patterned light output from the module.

In one embodiment which may be combined with one or more of the before-addressed embodiments, said first passive optical component comprises at least one of
- a piezo-electric element;
- a comb actuator;
- an electrode, more particularly two electrodes;
- an element comprising and electroactive polymer.

A piezo-electric element can deform, e.g., bend or shrink or stretch, in reaction to application of a voltage. This can be used, e.g., for deforming another portion of the first passive optical component. That other portion can be, e.g., a lens or a lens element or a mirror or a portion of a mirror.

A a comb actuator is usually micro-machined and has two parts which can be moved with respect to each other in reaction to electrostatic forces. This can be used, e.g., for stretching or compressing an object such as a diffraction grating. A grating constant of a sufficiently thin, e.g., silicon-based, diffraction grating can thus be changed.

Electroactive polymers can be deformed in a well-defined manner, e.g., by applying suitable voltages. This can be used for constructing deformable lenses or mirrors.

In one embodiment which may be combined with one or more of the before-addressed embodiments, said first passive optical component comprises at least one of
- a grating with adjustable grating constant;
- a housing in which at least two different fluids are present forming an interface of variable shape functioning as a lens of variable shape;
- a housing in which liquid crystals are present and at least one electrode (usually at least two electrodes);
- a micro-mirror array;
- a deformable reflective membrane;
- a solid but deformable plate, in particular wherein said plate is transparent, more particularly wherein said plate is in mechanical contact with a transparent deformable body the shape of which adjusts to a shape of said deformable plate.

The latter is a possible way of realizing an adjustable (deformable) lens.

In one embodiment which may be combined with one or more of the before-addressed embodiments, said light emission element comprises at least one of a light emitting diode, a laser, a xenon lamp.

Said light emitting diode can be a white-light emitting diode or an infrared diode. It can be, e.g., a high-intensity short-pulse light emitting diodes, e.g., like used in today's photo cameras or smart phones. In particular, light emitting diodes referred to as "high-brightness LEDs" can be used. It is also possible to use a superluminiscent light emitting diode.

Said laser can be, e.g., a diode laser. It can in particular be a vertical-cavity surface-emitting laser.

Said xenon lamp is a xenon gas discharge lamp, in particular a xenon flash lamp.

In one embodiment which may be combined with one or more of the before-addressed embodiments, said light emitting element is a packaged component. Alternatively, said light emitting element is provided as a bare die. Electrical connections between said light emitting element and said first substrate member can be accomplished by means of, e.g., through-hole technology or surface mount technology (SMT), in particular if said light emitting element is provided as a packaged component. But in particular if said light emitting element is provided as a bare die, electrical connections between said light emitting element and the first substrate member can be accomplished by means of, e.g., wire bonding or flip chip technology or using conductive glue or by means of a combination of at least two of these; e.g., electrically and mechanically connecting the bare die with its non-light-emitting side to the first substrate member by means of conductive glue and creating an electrical connection between the opposite (light-emitting) side of the bare die to the first substrate member by means of wire bonding.

In one embodiment which may be combined with one or more of the before-addressed embodiments, the module comprises
- a third substrate member arranged between said first and second substrate members;
- a second spacer member comprised in said second substrate member or comprised in said third substrate member or distinct from and located between these, which comprises at least one opening.

In this case, it may be provided that said first passive optical component is arranged at said third substrate member (e.g., thereon or therein). Generally, by provision of these additional members, more complex and more refined optical setups can be realized in the module.

Usually, it will be provided that said first and second substrate members are fixed with respect to each other. This fixing can be directly or, if said first spacer member is distinct from said first and second substrate members, indirectly via (at least) said first spacer member. Therein, bonding materials, e.g., epoxy resins, may be present between the respective members. If said third substrate member and said second spacer member are present, said fixing between said first and second substrate members can be indirectly via
- said first spacer member,
- said third substrate member and
- said second spacer member, wherein bonding materials may be present between the respective members.

In one embodiment which may be combined with one or more of the before-addressed embodiments, said opening in said first spacer member is surrounded by said first substrate member, said second substrate member and said first spacer member. More particularly, it can be delimited by these. Thus, a cavity is formed in the module. In said cavity, one or more passive optical components and/or one or more active optical components may be present. In particular, the opening or cavity encased in the module may be hermetically sealed. This may protect the inside of the module from detrimental influences such as from dust or dirt. Hence, optical components in the module can be protected this way, and light paths inside the module remain in good condition for a long time. It can be provided that said first substrate member, said second substrate member and said first spacer member are the items which delimit this opening or cavity.

The same applies analoguously for said opening in said second spacer member, referring to the second and third substrate members.

In one embodiment which may be combined with one or more of the before-addressed embodiments, the module comprises an inside volume and a housing enclosing said inside volume, said inside volume comprising or being comprised in said opening, said housing being, except for said one or more transparent portions, completely non-transparent, such that light can enter or exit said inside volume solely through said one or more transparent portions. In particular, it may be provided that said first spacer member and at least one of said first and second substrate members contribute to said housing or, more particularly, form said housing. Even more particularly, it may be provided that said first substrate member, said second substrate member and said first spacer member all contribute to said housing or, more particularly, even form said housing (usually only if said third substrate member and said second spacer member are not present). In presence of said third substrate member and said second spacer member, said inside volume usually is enclosed in a housing to which said first, second and third substrate members and said first and second spacer members contribute or which is even formed by these. A very compact packaged opto-electronic module may be realized in such a way. And the opto-electronic module can be realized using a very small number of parts only. Therein, it is possible to provide that not only the first but also the second substrate member comprises at least one transparent portion.

In one embodiment which may be combined with one or more of the before-addressed embodiments, said first substrate member, said second substrate member and said first spacer member are of generally block- or plate-like shape, possibly comprising at least one hole. A wafer-level manufacture of such opto-electronic modules may be well possible.

In one embodiment which may be combined with one or more of the before-addressed embodiments, outer bounds of a vertical silhouette of the module (i.e. the outer borders of a shape described by the opto-electronic module in a projection into a lateral plane) and outer bounds of a vertical silhouette of said first substrate member, said second substrate member and said first spacer member (i.e. the outer borders of a shape described by the respective member in a projection into a lateral plane) each describe a substantially rectangular shape. This can effect an enhanced manufacturability. In particular, all of the mentioned vertical silhouettes can describe one and the same rectangular shape. It can be provided that lateral dimensions of said first substrate member, said second substrate member and said first spacer member are substantially identical. It is well possible to wafer-level manufacture such opto-electronic modules, which in turn can result in high-precision high-volume manufacturing.

In one embodiment which may be combined with one or more of the before-addressed embodiments, at least one of said first and second substrate members, in particular both, said first and second substrate members, are, at least in part, made substantially of an at least substantially non-transparent material. Of course, said one or more transparent portions are not made of an at least substantially non-transparent material. Such a choice of material can inhibit undesired exit of light out of the opto-electronic module and/or avoid that undesired light enters the opto-electronic module. It may contribute to optically sealing the opto-electronic module, wherein, of course, the optical sealing is interrupted by the one or more transparent portions, in particular solely thereby.

Accordingly, it may be provided that the first substrate member is substantially in full, except, if present, for said one or more transparent portions, made substantially of an at least substantially non-transparent material. And, it may be provided that said second substrate member is substantially in full, except, if present, for said one or more transparent portions, made substantially of an at least substantially non-transparent material. Suitable non-transparent materials may be, e.g., polymer materials. Said first substrate member can be substantially (or at least predominantly) made of a printed circuit base material such as polyimide or an FR4 material.

In one embodiment which may be combined with one or more of the before-addressed embodiments, said first spacer member is (and if present, also said second spacer member), at least in part, made substantially of an at least substantially non-transparent material. This may contribute to optically sealing the opto-electronic module.

In one embodiment which may be combined with one or more of the before-addressed embodiments, said first spacer member is a unitary part, in particular wherein said first spacer member is distinct from said first and second substrate members. This can enhance the manufacturability of the first spacer member.

Said first spacer member, in particular when it is distinct from said first and second substrate members, can have a vertical extension which is limited to the vertical range from a first face of said first substrate member facing said second substrate member to a second face of said second substrate member facing said first substrate member. In presence of a third substrate member and a second spacer member, said first spacer member can have a vertical extension which is limited to the vertical range from said first face to a third face of said third substrate member facing said first substrate member.

Generally, a first spacer member, more particularly a separate first spacer member, can also be referred to as a spacer or as a distancing member, because it can effect a well-defined (vertical) distance between the first and second substrate members, more particularly between said first and second faces. In presence of a third substrate member and a second spacer member, said first spacer member can effect a well-defined (vertical) distance between the first and third substrate members, more particularly between said first and third faces; and said second spacer member can effect a well-defined (vertical) distance between the second and third substrate members, more particularly between corresponding (inside) faces of these.

In one embodiment which may be combined with one or more of the before-addressed embodiments, said first spacer member is at least one of made of a hardened hardenable material and obtained using a replication process. This can make possible to achieve an enhanced manufacturability. This can make possible to provide first spacer members in form of unitary parts in an efficient way and in high precision. If present, this may apply to said second spacer wafer, too.

In one embodiment which may be combined with one or more of the before-addressed embodiments, said first substrate member substantially is a printed circuit board or a printed circuit board assembly. This can be useful for electrically contacting said light emission element or, if present, further active optical components comprised in the module. A substrate member embodied as a printed circuit board or printed circuit board assembly can provide one or more electrical connections across this respective substrate member.

In one embodiment which may be combined with one or more of the before-addressed embodiments, the module comprises, in addition, another passive optical component, in particular an at least partially reflective element. Not only simple, but also more complex optical setups may be provided in the module.

In one embodiment which may be combined with one or more of the before-addressed embodiments, said one or more transparent portions comprise a passive optical component not identical with said first passive optical component, in particular one or more of a prism, a lens, a lens element, wherein the latter may be diffractive and/or refractive ones. This can optically enhance the module and/or contribute to minimizing the size of the module and/or improve the manufacturability of the module.

In one embodiment which may be combined with one or more of the before-addressed embodiments, at least one non-transparent blocking portion is provided surrounding (more specifically: laterally enclosing) at least a first of said one or more transparent portions, wherein said at least one non-transparent blocking portion is comprised in the respective member comprising said first of said one or more transparent portions. More particularly, it can be provided that each of said one or more transparent portions is surrounded (more specifically: laterally enclosed) by said at least one blocking portion. Accordingly, it can be provided that a substrate wafer comprising one or more transparent portions comprises at least one portion, referred to as blocking portion, which is at least substantially non-transparent for at least a specific wavelength range, and at least one other portion, namely a transparent portion, which is at least substantially transparent for at least said specific wavelength range.

By way of providing one or more blocking portions, it can be achievable to have one or more well-defined ways for light entering and/or exiting the module while blocking light from entering or exiting the module on other ways through the first substrate member.

In one embodiment which may be combined with one or more of the before-addressed embodiments, said one or more transparent portions are, at least in part (and in particular substantially in full), substantially made of a transparent material, in particular of a hardened hardenable material. The one or more transparent portions may be manufactured using replication, e.g., embossing.

In one embodiment which may be combined with one or more of the before-addressed embodiments, said at least one opening in said first spacer member is delimited and, in particular fully enclosed, by said first and second substrate members and said first spacer member, wherein in case said third substrate member and said second spacer member are provided, at least one of the following may apply:

said at least one opening in said first spacer member is delimited and, in particular fully enclosed, by said first and third substrate members and said first spacer member;

said at least one opening in said second spacer member is delimited and, in particular fully enclosed, by said second and third substrate members and said second spacer member.

Such embodiments can be useful for realizing optically and/or hermetically sealed modules or module portions. At least one or two or three or even more cavities can be formed in such a module. In said cavities, one or more passive optical components and/or one or more active optical components may be present. In particular, the openings or cavities encased in the module may be hermetically sealed. This may protect their respective insides from detrimental influences such as dust or dirt. Hence, optical components in the module can be protected this way, and light paths inside the module remain in good condition for a long time.

In one embodiment which may be combined with one or more of the before-addressed embodiments, a maximum vertical extension of the module is at most 45 mm, in particular at most 30 mm.

In one embodiment which may be combined with one or more of the before-addressed embodiments, a maximum lateral extension of the module is at most 50 mm, in particular at most 30 mm.

The appliance comprises a multitude of opto-electronic modules of the above-described kind. These opto-electronic modules are usually arranged in a common plane and side by side. The appliance can in particular be a wafer stack. Such an appliance or wafer stack is particularly useful for mass-producing above-described modules.

In one embodiment of the appliance, the appliance comprises
a first wafer comprising a multitude of said first substrate members;
a second wafer comprising a multitude of said second substrate members;
a third wafer comprising a multitude of said first spacer members, wherein said third wafer is comprised in said first wafer or is comprised in said second wafer or is distinct from these;
a multitude of said light emission elements; and
a multitude of said first passive optical components;
wherein at least one of said first and second wafers comprises a multitude of transparent portions.

Such an appliance or wafer stack is particularly useful for mass-producing herein described opto-electronic modules.

In one embodiment, the appliance comprises
a first substrate wafer comprising a multitude of said first substrate members;
a second substrate wafer comprising a multitude of said second substrate members;
a first spacer wafer comprising a multitude of said first spacer members, wherein said first spacer wafer is comprised in said first substrate wafer or is comprised in said second substrate wafer or is distinct from these;
a multitude of said light emission elements; and
a multitude of said first passive optical components;
wherein at least one of said first and second substrate wafers comprises a multitude of transparent portions.

Therein, said first passive optical components may in particular be comprised in or arranged at said first or second substrate wafer.

In such an appliance, usually,
one of said light emission elements;
one or more of said transparent portions and optical portions; and
one of said first passive optical components;
are allocated with each other. After a separation step, these will belong to one and the same module.

It is possible to provide that said first substrate wafer substantially is a printed circuit board or a printed circuit board assembly.

In one embodiment of the appliance, the appliance comprises in addition
a third substrate wafer comprising a multitude of third substrate members;
a second spacer wafer comprising a multitude of second spacer members, wherein said second spacer wafer is comprised in said third substrate wafer or is comprised in said second substrate wafer or is distinct from these.

The order in which the members are arranged in such an appliance usually is: first substrate member, first spacer member, second substrate member, second spacer member, third substrate member.

The method for manufacturing an opto-electronic module comprises the steps of
a) providing a first substrate wafer on which a multitude of light emission elements are arranged;
b) providing a second substrate wafer;
c) providing a first spacer wafer, wherein said first spacer wafer is comprised in said first substrate wafer or is comprised in said second substrate wafer or is distinct from these, and wherein said first spacer wafer comprises a multitude of openings;
d) providing a multitude of first passive optical components, each of said first passive optical component having adjustable optical properties;
e) forming a wafer stack comprising said first substrate wafer, said second substrate wafer, said first spacer wafer, said multitude of light emission elements and said multitude of first passive optical components;
wherein at least one of said first and second substrate wafers comprises a multitude of transparent portions. In particular, step e) may comprise the step of
e1) arranging said first and second substrate wafers, said first spacer wafer, said light emission elements and said first passive optical components such that said first spacer wafer is arranged between said first and second substrate wafers and that each of said multitude of first passive optical components is allocated with a light emission element of said multitude of light emission elements, with an opening of said multitude of openings and with one of said multitude of transparent portions;
wherein at least one of said first and second substrate wafers comprises a multitude of transparent portions.

This way, efficient mass-production of opto-electronic modules of high precision may be achieved.

Said transparent portions are usually provided for allowing light originating from a light emission element to exit the corresponding module. Accordingly, light can pass through said transparent portions.

In one embodiment, the method comprises the step of
l) positioning each of said multitude of light emission elements on a first face of said first substrate wafer using a pick-and-place step.

The light emission elements can be bonded to said first substrate member, e.g., by reflowing, in particular for establishing an electrical connection between them.

In one embodiment which may be combined with the before-addressed method embodiment, the method comprises the step of
m) manufacturing each transparent portion of said multitude of transparent portions or a portion of these using a replication process, in particular embossing.

Said transparent portions are in this case not necessarily manufactured in full using a replication process, but each of them may be manufactured in part using a replication process.

In one embodiment which may be combined with one or more of the before-addressed method embodiments, the method comprises at least one of the steps of
n1) manufacturing, at least in part, said first substrate wafer using a replication process, in particular embossing;
n2) manufacturing, at least in part, said second substrate wafer using a replication process, in particular embossing;
n3) manufacturing, at least in part, said first spacer wafer using a replication process, in particular embossing.

Replication can allow mass production of finely structured parts with high precision.

In general, replication processes based on embossing comprise the steps of
i) depositing replication material on a substrate;
ii) bringing a replication tool into contact with said replication material;
iii) hardening said replication material;
iv) removing said replication tool.

A suitable replication tool can in particular comprise a multitude of replication regions each having a surface structure corresponding to a negative of a surface structure to be produced. Step i) may, e.g., be carried out using a dispenser forming a single portion of replication material for each surface structure to be produced.

In one embodiment which may be combined with one or more of the before-addressed method embodiments, the method comprises the step of
f) separating said wafer stack into said multitude of opto-electronic modules.

In particular, it can be provided that each of said opto-electronic modules comprises
at least one of said multitude of transparent portions;
at least one of said multitude of light emission elements;
at least one of said multitude of first passive optical components; and
at least one of said multitude of openings.

Each of said opto-electronic modules can be an opto-electronic module as described further above in the present patent application.

Said separating can be accomplished using known dicing techniques, e.g., sawing, laser cutting and others.

In one embodiment which may be combined with one or more of the before-addressed method embodiments, the method comprises the steps of
x) providing a third substrate wafer;
y) providing a second spacer wafer comprised in said third substrate wafer or comprised in said second substrate wafer or distinct from these; which comprises a multitude of openings;
wherein step e) is replaced by the step of
e') forming a wafer stack comprising said first substrate wafer, said second substrate wafer, said third substrate wafer, said first spacer wafer, said second spacer wafer said multitude of light emission elements and said multitude of first passive optical components.

The invention comprises opto-electronic modules with features of corresponding methods according to the invention, and, vice versa, also methods with features of corresponding opto-electronic modules according to the invention.

The advantages of the opto-electronic modules basically correspond to the advantages of corresponding methods, and, vice versa, the advantages of the methods basically correspond to the advantages of corresponding opto-electronic modules.

Furthermore, a method for manufacturing a device is provided. The method for manufacturing the device, said device comprising an opto-electronic module and a printed circuit board, comprises mounting said opto-electronic module on said printed circuit board. Alternatively (or additionally), the method can comprise manufacturing said opto-electronic module according to one of the above-described methods. In particular, said opto-electronic module is an opto-electronic module of the above-described kind. Said mounting may comprise at least one of placing said opto-electronic module on said printed circuit board using a pick-and-place process and bonding said opto-electronic module to said printed circuit board, e.g., by reflowing.

The device according to the invention comprises a module of the above-described kind, in particular wherein said device comprises a printed circuit board to which said module is operationally connected.

In particular, the device can be a photographic or video device such as a digital camera, a communication device such as a smart phone, it can be a hand-held device and/or a mobile computing device. It can in particular be a flash unit or a sensor unit, in particular for photographic applications. The device can also be an attachment to an electronic device, the attachment usually comprising electrical contacts by means of which an electric connection is accomplished between the attachment and the electronic device when the attachment is attached to the electronic device. Such an attachment can form, when attached to the electronic device, a portion of the housing of the electronic device, e.g., a back panel (either attached to an already existing back pantel, or replacing a formerly attached back panel).

The uses according to the invention are uses of an opto-electronic module according to the invention. Such an opto-electronic module can be used for flash-illuminating a scene with an adjustable intensity distribution. It can also be used for projecting a light pattern on a scene. It can be used for creating a light pattern on a scene. And it can also be used for scanning one or more light beams across a scene, in particular for creating a light pattern on a scene. Any of these uses may be applied in particular in photography, more particularly immediately before or during recording an image.

Further embodiments and advantages emerge from the dependent claims and the figures.

BRIEF DESCRIPTION OF THE DRAWINGS

Below, the invention is described in more detail by means of examples and the included drawings. The figures show in a strongly schematized manner:

FIG. 20 an illustration of an effect of changed optical properties of a passive optical component in an opto-electronic module;

FIG. 21 an illustration of an effect of changed optical properties of a passive optical component in an opto-electronic module;

FIGS. 22 to 24 illustrations of effects of changed optical properties of a passive optical component in an opto-electronic module;

FIG. 25 an illustration of an effect of changed optical properties of a passive optical component in an opto-electronic module;

FIG. 26 an illustration of a pattern projected by an opto-electronic module comprising a passive optical component with adjustable optical properties;

FIG. 27 an illustration of an intensity distribution along the dotted line through the pattern illustrated in FIG. 26;

FIG. 28 an illustration of a pattern projected by an opto-electronic module comprising a passive optical component with adjustable optical properties.

The described embodiments are meant as examples and shall not confine the invention.

DETAILED DESCRIPTION OF THE INVENTION

Figure 1:
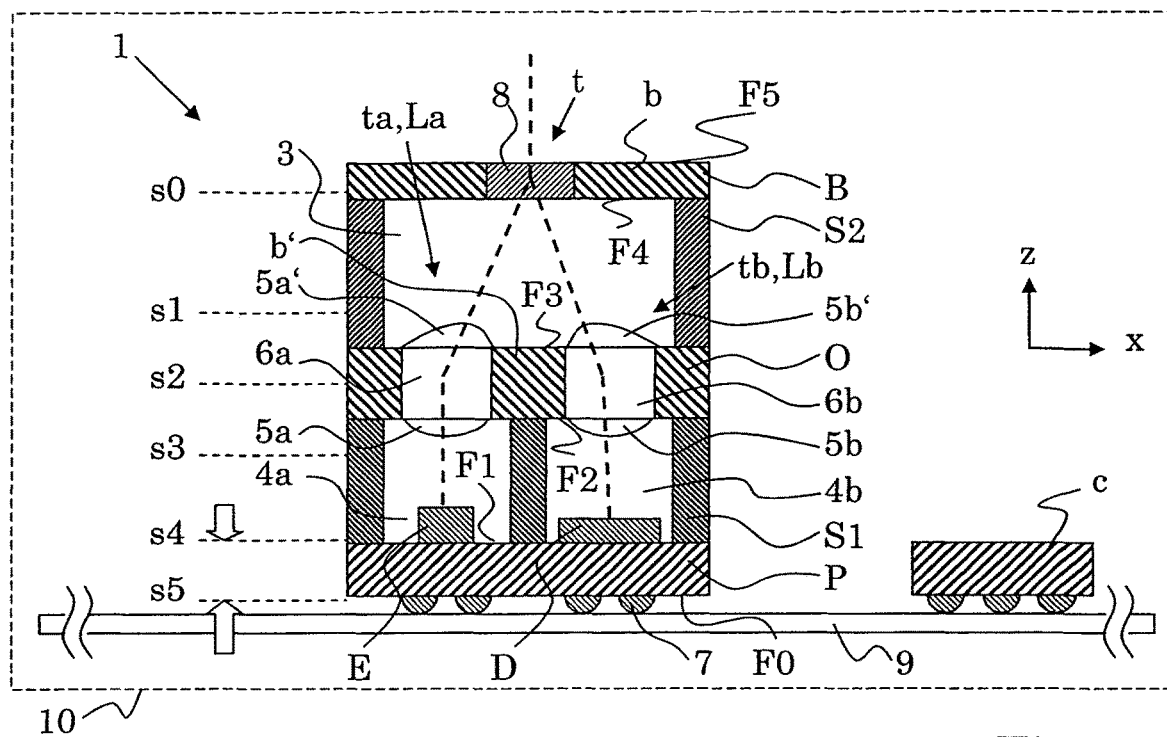
FIG. 1 a cross-sectional view of an opto-electronic module.

FIG. 1 illustrates a cross-sectional view of an opto-electronic module 1 having a passive optical component 8 which can be embodied in various ways which will be discussed in more detail below. At the same time, FIG. 1 illustrates a device 10 comprising such a module 1.

Figure 2:
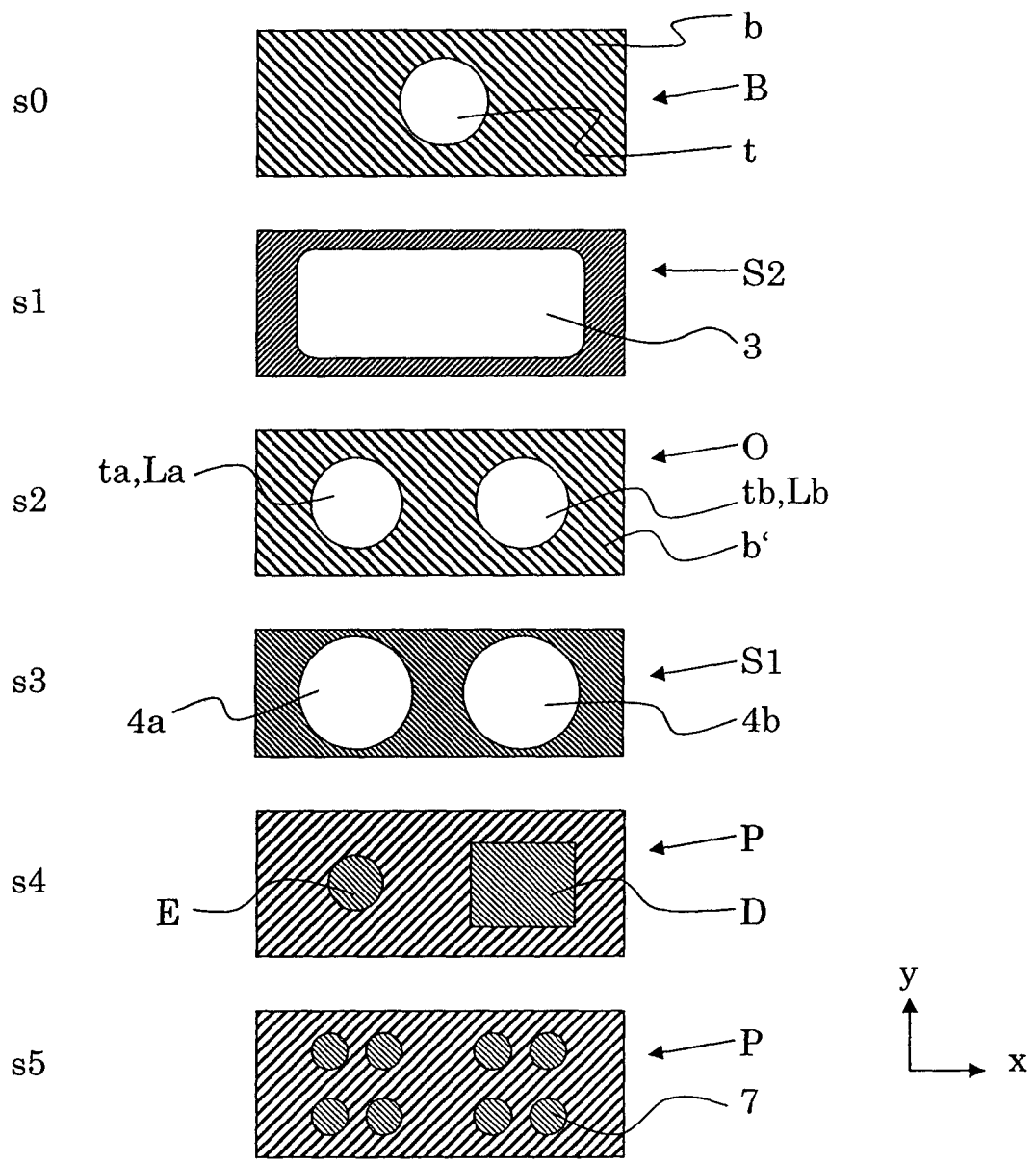
FIG. 2 various cross-sectional views of constituents of the module of FIG. 1.

The illustrated cross-section is a vertical cross-section. FIG. 2 shows various lateral schematic cross-sectional views of constituents of the module of FIG. 1, wherein the approximate positions of these lateral cross-sections are indicated in FIG. 1 by s0 to s5 and dashed lines. For s4 and s5, the direction of view is indicated by arrows.

Device 10 can be, e.g., an electronic device and/or a photographic device, in particular a flash unit. It may be, e.g., a hand-held communication device such as a smart phone. Further possibilities are cited elsewhere in the present patent application. Module 1 is particularly suitable for such applications because it can be manufactured having a particularly small size and it is mass-producible using wafer-level manufacturing techniques. Device 10 comprises, besides module 1, a printed circuit board 9 on which module 1 is mounted. In addition mounted on printed circuit board 9 is an integrated circuit c such as a control unit or controller chip which is operationally interconnected with module 1 by printed circuit board 9. E.g., integrated circuit c may evaluate signals outputted by module 1 and/or rather provide signals to module 1 for controlling the same.

Module 1 comprises several constituents (P, S1, O, S2, B) stacked upon each other in a direction through which the term "vertical" is defined; it corresponds to the z direction (cf. FIG. 1). Directions in the x-y plane (cf. FIG. 2) perpendicular to the vertical (z) direction are referred to as "lateral".

Module 1 comprises a first substrate member P, a first spacer member S1, a second substrate member O, a second spacer member S2 and a third substrate member B, all stacked upon each other. The members comprise faces F0, F1, F2, F3, F4 and F5 as indicated in FIG. 1. Substrate member P is, e.g., a printed circuit board or printed circuit board assembly. The printed circuit board (PCB) of this PCB assembly can more specifically also be referred to as an interposer. On the PCB, a light emission element E for emitting light, e.g., infrared light or visible light, is mounted. This can be, e.g., a light-emitting diode or a laser diode, in particular a VCSEL (vertical-cavity surface-emitting laser), or a xenon lamp. Furthermore, another active optical component, referenced D, is mounted on substrate member P. Active optical component D can be another light emission element or a light detecting element D for detecting light, in particular for detecting light emittable by light emission element E. In this case, it can in particular be, e.g., an image detector or a one-dimensional detector such as a linear array of photo diodes. In case D is another light emission element, it can be of the same kind as light emission element E or of different kind.

Electrical contacts of light emission element E and active optical component D are electrically connected (across substrate member P) to the outside of module 1, where solder balls 7 are attached. Instead of providing solder balls 7, it would also be possible to provide contact pads on the PCB which are not (or at a later time) provided with solder balls.

This way, module 1 can be mounted on printed circuit board 9, e.g., in surface mount technology (SMT), next to other electronic components, such as integrated circuit c.

Spacer member S1 has two openings 4a, 4b, light emission element E arranged in one of them (4a) and active optical component D being arranged in the other (4b). This way, light emission element E and active optical component D are laterally encircled by separating member S1, and two separate channels are formed in module 1, in particular two optically separate channels in the space between substrate members P and O. This can be of particular importance if active optical component D is a light detecting element.

Spacer member S1 may fulfill several tasks. It can ensure a well-defined distance between member P and member O (through its vertical extension) which can help to achieve well-defined light paths from emitting member E through member O (through transparent portion ta), and between opening 3, member O (via transparent portion tb) and active optical component D. Therefore, spacer member S1 can also be referred to as a separation member (separation member S1).

In case active optical component D is a light detecting element, spacer member S1 can also provide protection of light detecting element D from light that is not supposed to be detected by detection element D, by being substantially non-transparent to light generally detectable by light detecting element D and by forming a portion of the outside walls of module 1. And, in that same case, spacer member S1, more particularly spacer portion Sb can also provide protection of light detecting element D from light emitted by emitting member E which should not reach light detecting element D, so as to reduce optical cross-talk between light emission element E and detecting member D, by being substantially non-transparent to light (in particular to light generally detectable by light detecting element D) and by forming a wall (or: channel separator) between light emission element E and light detecting element D, in form of spacer, portion Sb.

Light reflected inside module 1 and stray light originating from light emission element E can be kept from reaching light detecting element D this way. Typically, separating member S1 is made of a polymer material, in particular of a hardenable or more specifically curable polymer material, e.g., of an epoxy resin.

Member O comprises a blocking portion b' and two transparent portions ta and tb, respectively, one (ta) for allowing light emitted by light emission element E to leave opening 4a and enter opening 3, and another one (tb) for allowing light emitted by active optical component D to leave opening 4b and enter opening 3 or for allowing light to enter opening 4b from opening 3 and reach active optical component D.

Transparent portions ta, tb each comprise a passive optical component La and Lb, respectively, more particularly and as in the illustrated example, a lens member each, for light guidance and/or beam forming. Lens members La, Lb may, e.g., comprise, as shown in FIG. 1, two lens elements 5a, 5a' and 5b, 5b', respectively, in close contact to a transparent element 6a and 6b, respectively. Transparent elements 6a, 6b can have the same vertical dimension as member O where it forms blocking portion b', such that substrate member O where it forms blocking portion b' together with transparent elements 6a, 6b describes a (close-to-perfect) solid plate shape. Lens elements 5a, 5a', 5b, 5b', redirect light by refraction (cf. FIG. 1) and/or by diffraction (not illustrated). E.g., they may all be of generally convex shape (as shown in FIG. 1), but one or more of the lens elements may be differently shaped, e.g., generally or partially concave. Lens elements 5a', 5b' may be, e.g., aspherical lens elements, as illustrated in FIG. 1.

Spacer member S2 has one opening 3 which laterally encircles a volume present between substrate members B and O.

Spacer member S2 may fulfill several tasks. It can ensure a well-defined distance between substrate member B and substrate member O (through its vertical extension) which can help to achieve well-defined light paths between passive optical component 8 and each of the transparent portions ta and tb. Therefore, spacer member S2 can also be referred to as a separation member (separation member S2).

Spacer member S2 can also provide protection against light entering the before-mentioned volume that is not supposed to enter that volume, namely by being substantially non-transparent to light and by forming a portion of the outside walls of module 1. Forming a non-transparent portion of the outside wall can help to avoid light escaping module 1 along undesired ways. Typically, separating member S2 is made of a polymer material, in particular of a hardenable or more specifically curable polymer material, e.g., of an epoxy resin.

Substrate member B is, at least predominantly, made of a non-transparent material such as a non-transparent polymer material. This is the case at least in the region where passive optical component 8 is not present. In the example of FIGS. 1 to 4, member B comprises a transparent portion t (because of passive optical component 8 being transparent at least in part). Where member B is made of non-transparent material, it forms a blocking portion b. Similar to what has been explained for member O (for transparent portions ta, tb and blocking portion b'), transparent portion t and blocking portion b help to provide well-defined light paths.

The volumina laterally enclosed by spacer members S1,S2 can in particular be hermetically sealed, which prevents dust or other particles from degrading optical properties.

Light emitted by light emission element E having passed transparent region ta will be influenced by passive optical component 8 in selectable ways. Passive optical component 8 has adjustable optical properties. Depending on the concrete embodiment of passive optical component 8, it can, e.g., steer light beams in selectable ways and/or it can selectively attenuate portions of light. A result achievable by passive optical component 8 is that an intensity distribution of light emitted from module 1 is adjustable, namely via passive optical component 8.

Such a module 1 may be a flash module allowing to illuminate a scene using a specifically selected light intensity distribution, e.g., a light distribution selected in dependence of the intrinsic illumination of the scene. E.g., dark portions of the scene can be illuminated more strongly by module 1 than brighter portions.

The lateral shape of openings 3, 4a and 4b and also of transparent portions t, ta, tb may, e.g., be circular or have other appearances, e.g., polygonal or rectangular with rounded corners.

Module 1 is an opto-electronic component, more precisely a packaged opto-electronic component. The vertical side walls of module 1 are formed by members P, S1, S2, O and B. A bottom wall is formed by substrate member P, and a top wall by substrate member B.

As is well visible in FIG. 2, the five members P, S1, S2, O, B, which can for the reasons above also be referred to as housing components, all have substantially the same lateral shape and lateral dimensions. This is related to a possible and very efficient way of manufacturing such modules 1 which is described in more detail below referring to FIGS. 3 and 4. These housing components P, S1, S2, O, and B are all of generally block- or plate-like shape or more generally of generally rectangular parallelepiped shape, possibly having holes or openings (such as spacer members S1, S2 do) or projections (such as substrate member O does).

It is furthermore possible to provide modules which are designed according to the same principles as discussed above, but comprising one or more additional electronic components such as one or more additional active optical components, e.g., light detectors or light sources, or one or more integrated circuits. Additional passive optical components may be provided as well. And it is also possible to provide less active optical components and/or less passive optical components, as is also illustrated, e.g., in FIGS. 5 to 8 discussed further below.

The active electronic components comprised in a module (such as light emission element E and active optical component D in the example of FIG. 1) can be packaged or unpackaged electronic components. For contacting substrate member P, technologies such as wire-bonding or flip chip technology or any other known surface mount technologies may be used, or even conventional through-hole technology.

Figure 3:
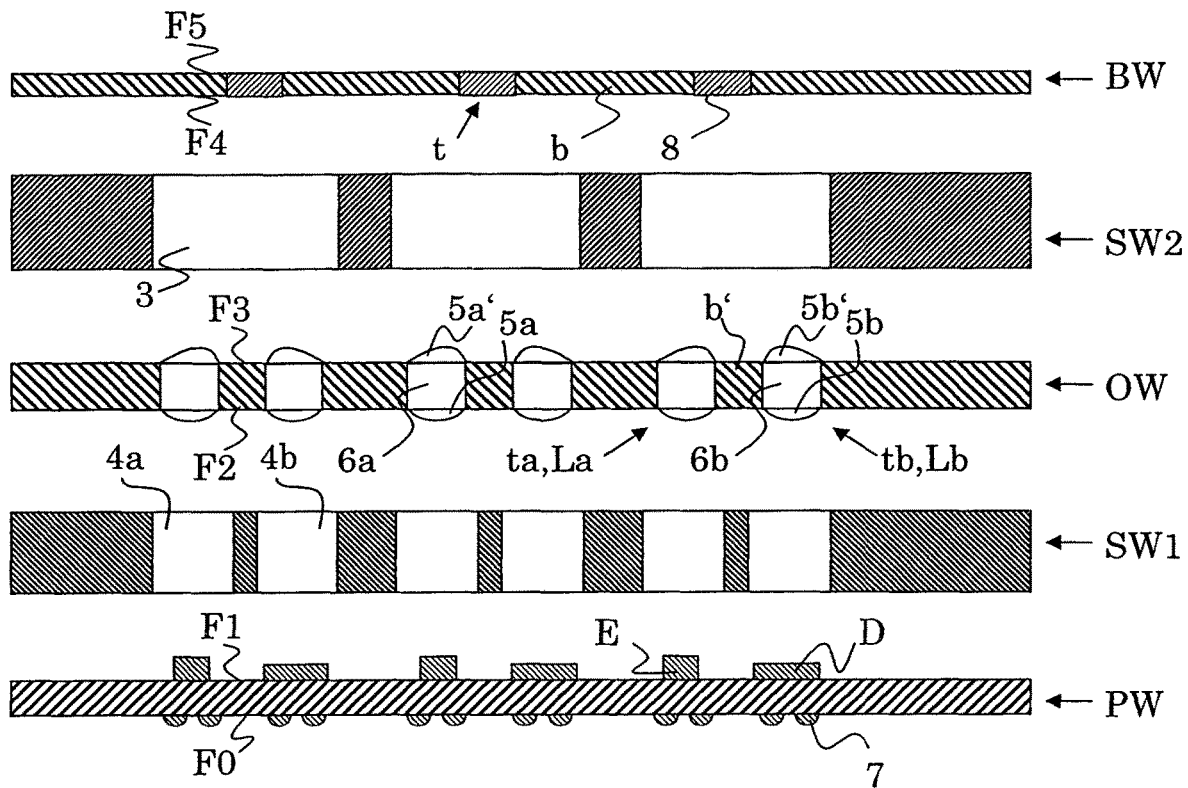
FIG. 3 a cross-sectional view of wafers for forming a wafer stack for manufacturing a multitude of modules of FIG. 1.

FIG. 3 shows a schematical cross-sectional view of wafers for forming a wafer stack for manufacturing a multitude of modules 1 as shown in FIG. 1. It is possible to manufacture such modules 1 (practically) completely on wafer-scale, of course with a subsequent separation step. Although FIGS. 3 and 4 only show provisions for three modules 1, there will usually be in one wafer stack provisions for at least 5, rather at least 10 or even more than 30 modules in each lateral direction. Typical dimensions of each of the wafers are: laterally at least 5 cm or 10 cm, and up to 30 cm or 40 cm or even 50 cm; and vertically (measured with no components arranged on substrate wafer PW) at least 0.2 mm or 0.4 mm or even 1 mm, and up to 6 mm or 10 mm or even 20 mm.

Five wafers are sufficient for manufacturing a multitude of modules as shown in FIG. 1: A substrate wafer PW, two spacer wafers SW1 and SW2, a substrate wafer OW and a substrate wafer BW. Each wafer comprises a multitude of the corresponding members comprised in the corresponding module 1 (cf. FIGS. 1 and 2), usually arranged on a rectangular lattice, typically leaving a little distance from each other for a wafer separation step.

Substrate wafer PW can be a PCB assembly comprising a PCB of standard PCB materials, provided with solder balls 7 on the one side and with active optical components (E and D) bonded (e.g. soldered) to the other side. The latter can be placed on substrate wafer PW by pick-and-place using standard pick-and-place machines.

In order to provide maximum protection from detecting undesired light (if D refers to a light detecting element) or (if D refers to a light emission element) from emitting light out of module 1 in undesired places, all wafers PW, SW1, SW2, OW, BW can substantially be made of a material substantially non-transparent (in particular for light detectable by detecting members D), of course except for transparent areas such as transparent portions t, ta, tb and openings 3, 4a, 4b.

Wafers SW1 and SW2 and possibly also all or a portion of wafers OW and BW can be produced by replication. In an exemplary replication process, a structured surface is embossed into a liquid, viscous or plastically deformable material, then the material is hardened, e.g., by curing using ultraviolet radiation or heating, and then the structured surface is removed. Thus, a replica (which in this case is an negative replica) of the structured surface is obtained. Suitable materials for replication are, e.g., hardenable (more particularly curable) polymer materials or other replication materials, i.e. materials which are transformable in a hardening step (more particularly in a curing step) from a liquid, viscous or plastically deformable state into a solid state. Replication is a known technique, cf., e.g., WO 2005/083789 A2 for more details about this.

In case of substrate wafer OW, replication or molding may be used for obtaining the non-transparent portions (blocking portions b'). It would also be possible to provide holes, where transparent portions ta, tb are supposed to be, by drilling or by etching.

Subsequently, a so-obtained precursor wafer is provided with passive optical components La, Lb, so as to yield substrate wafer OW. This may be accomplished by means of replication, e.g., forming lens members La, Lb as a unitary parts, e.g., as described in US 2011/0043923 A1. The lens members La, Lb can, however, also be manufactured starting from a semi-finished part being a wafer comprising transparent elements 6a, 6b within holes by which transparent portions ta, tb are defined. This can be particularly useful when the lens members La, Lb each describe at least one apex, and those apices are located outside a vertical cross-section of the substrate wafer OW. Such a semi-finished part is (usually, and in the exemplary case shown in the figures) a flat disk-like wafer having no holes penetrating the wafer (in the regions where the transparent portions ta, tb shall later on be) and having virtually no or only shallow surface corrugations, such surface corrugations usually being concave, i.e. not extending beyond the wafer surface as described by the blocking portions b.

A semi-finished part like that can be obtained starting from a flat precursor wafer (typically made of exactly one material) having holes or openings where the transparent portions are supposed to be and then filling the holes with transparent material, e.g., using a dispensing process, and either filling the holes in the precursor wafer one-by-one, e.g., using a dispenser such as used for underfilling processes in flip-chip technology or the like, or by filling several holes at once, e.g., using a squeegee process (e.g. as known from screen printing) or a dispenser with several hollow needles outputting material. During the dispensing, the wafer can be placed on a flat support plate, e.g., made of a silicone. Care has to be taken order to prevent the formation of air bubbles or cavities in the dispensed material, since this would degrade the optical properties of the lens members La, Lb to be produced. E.g., one can carry out the dispensing in such a way that wetting of the wafer material starts at an edge formed by the wafer and an underlying support plate (or in a place close to such an edge), e.g., by suitably guiding a hollow needle outputting the material close to such an edge. Subsequently, the dispensed material is cured, e.g., by heat or UV radiation, so as to obtain hardened transparent material.

Convex meniscuses possibly formed this way can be flattened by polishing, so as to obtain transparent elements 6a, 6b having parallel surfaces adjusted to the wafer thickness. Then, by means of replication, lens elements 5a, 5a', 5b, 5b' are applied to typically both sides (top and button side) of wafer OW, e.g., using replication, in particular embossing. In case of concave meniscuses of the transparent elements, the replication can take place on these, wherein the amount of applied replication material might have to be adjusted accordingly.

As is mentioned and described elsewhere in the present patent application, it is generally possible to provide that said spacer wafers SW1 and/or SW2 are obsolete in the sense that a particular kind of substrate wafer is provided. Namely a wafer ("combined wafer" or "combined substrate wafer") which incorporates the features and functionalities of the respective spacer wafer and the respective substrate wafer. Producing such a "combined wafer" may be accomplished using a particular precursor wafer and, manufactured based thereon, a particular semi-finished part. Such a precursor wafer and semi-finished part, respectively, has at least one structured surface, usually having protrusions extending vertically beyond at least one of the two surfaces of transparent elements 6a,6b to be provided in the precursor wafer and present in the semi-finished part, respectively. Looking upon wafers OW and SW1 (or, e.g., wafers OW and SW2, or wafers BW and SW2, or wafers OW and SW1 and SW2) in FIG. 4 as one single part, it can be readily visualized what a corresponding "combined wafer" for manufacturing a module according to FIG. 1 and also a corresponding semi-finished part would look like.

The same idea of combining one or two spacer members (or spacer wafers) in an adjacent substrate member (or adjacent substrate wafer) applies also to any other described embodiment; in some embodiments, explicit examples are illustrated.

The materials and ways of manufacturing explained here for wafer OW can also applied for wafer BW, in particular when wafer BW (and, accordingly, also member B) comprises further passive optical components in addition to passive optical component 8 and/or transparent elements such as transparent elements ta, tb in the example of FIGS. 1 to 4.

In order to form a wafer stack 2, the wafers are aligned and bonded together, e.g., by gluing, e.g., using a heat-curable epoxy resin. It is usually a critical point to ensure that each active optical component (such as D and E on the substrate wafer PW) is sufficiently accurately allocated with a corresponding passive optical component (such as lens members La, Lb of substrate wafer OW and passive optical components 8 of wafer B).

Figure 4:
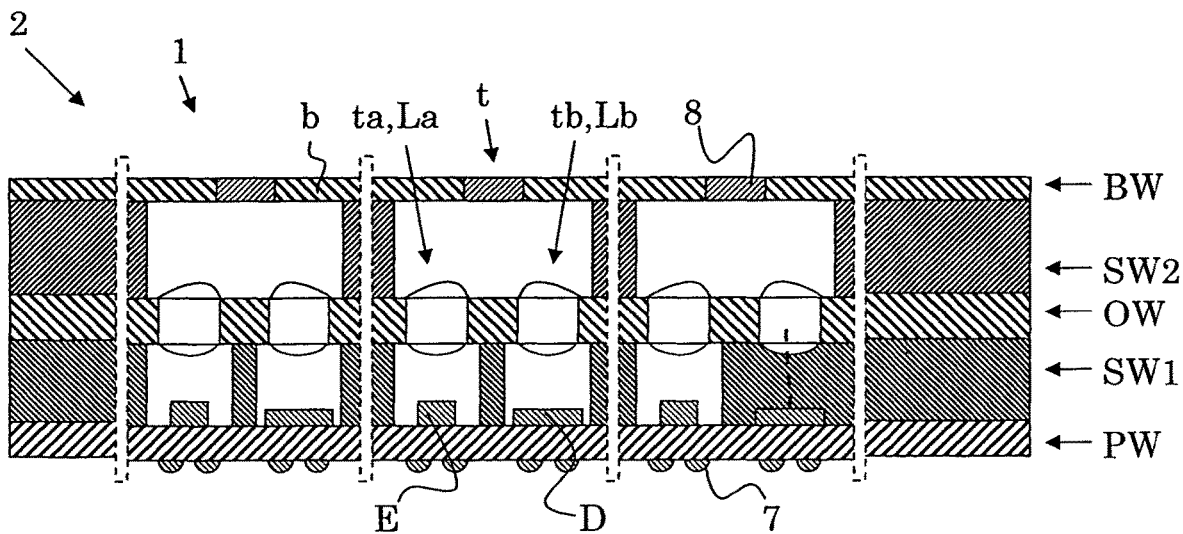
FIG. 4 a cross-sectional view of a wafer stack for manufacturing a multitude of modules of FIG. 1.

FIG. 4 shows a cross-sectional view of a so-obtained wafer stack 2 for manufacturing a multitude of modules 1 as shown in FIG. 1. The thin dashed rectangles indicate where separation takes place, e.g., by means of using a dicing saw.

The fact that most alignment steps are carried out on wafer level makes it possible to achieve a good alignment (in particular of active optical components D and E with respect to members La, Lb and all of these with respect to sensing element 8) in a rather simple and very fast way. The overall manufacturing process is very fast and precise.

Due to the wafer-scale manufacturing, only a very small number of production steps is required for manufacturing a multitude of modules 1.

Figure 5:
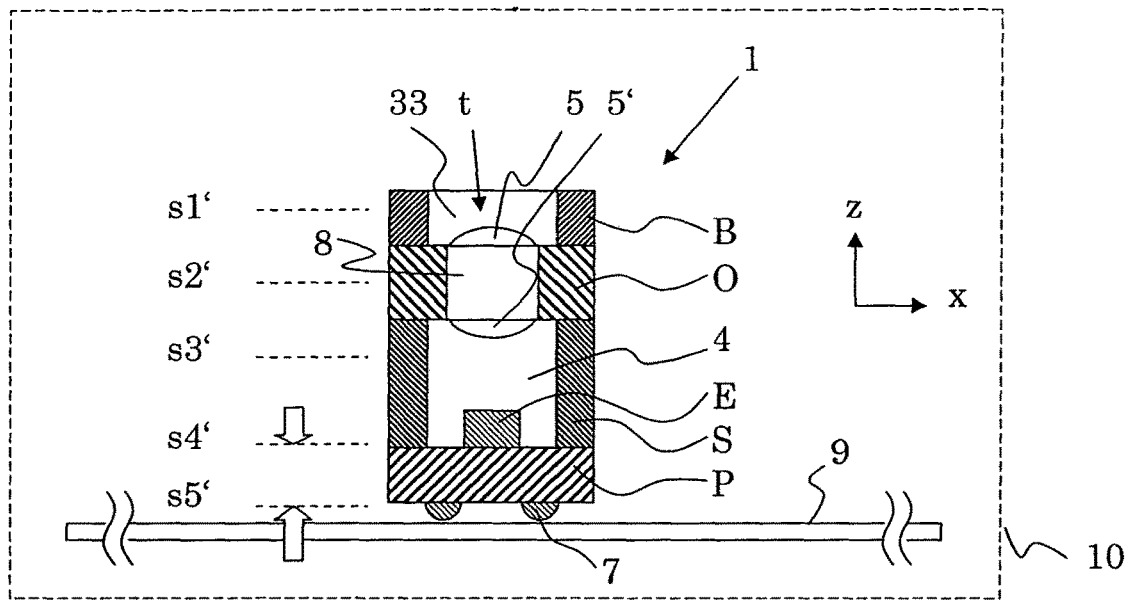
FIG. 5 a cross-sectional view of an opto-electronic module.
Figure 6:
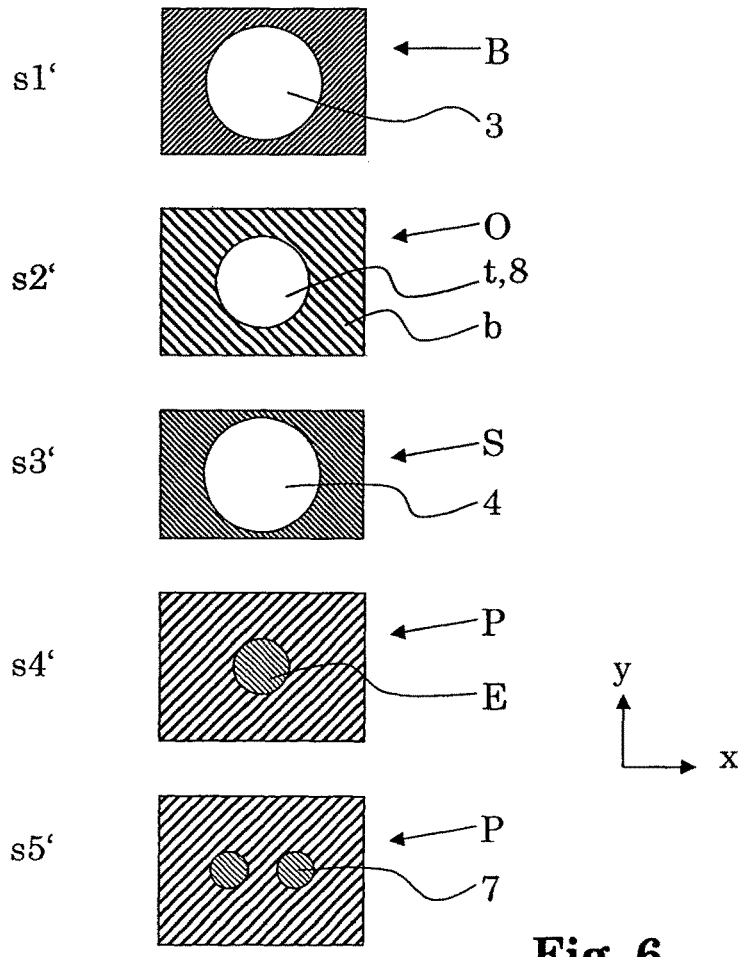
FIG. 6 various cross-sectional views of constituents of the module of FIG. 5.
Figure 7:
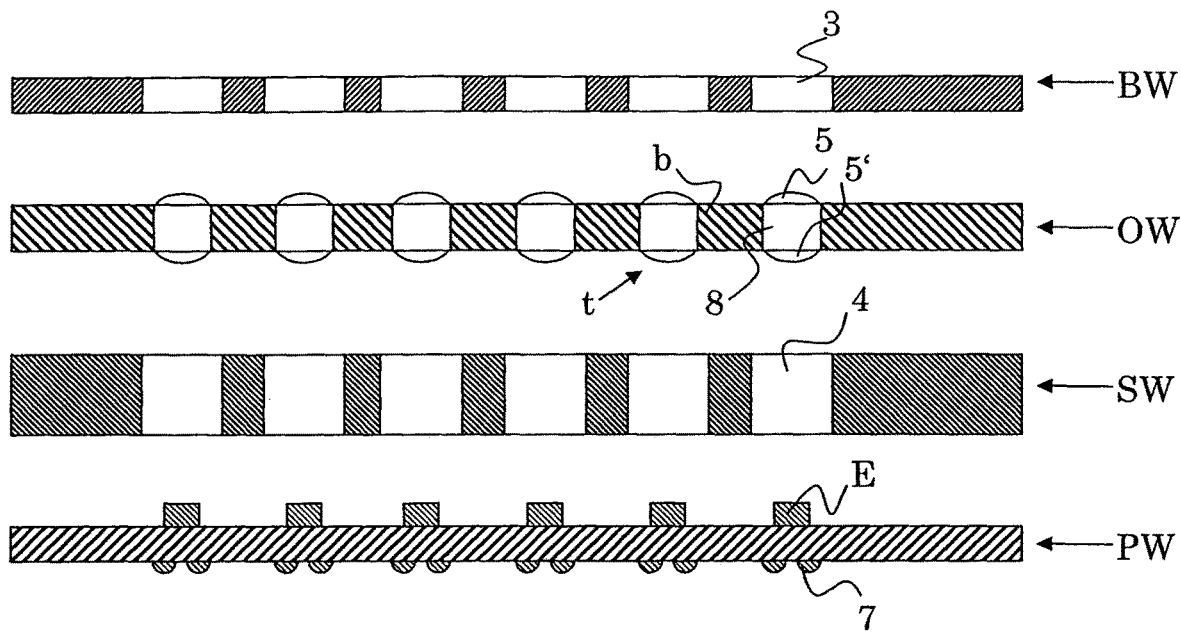
FIG. 7 a cross-sectional view of wafers for forming a wafer stack for manufacturing a multitude of modules of FIG. 5.
Figure 8:
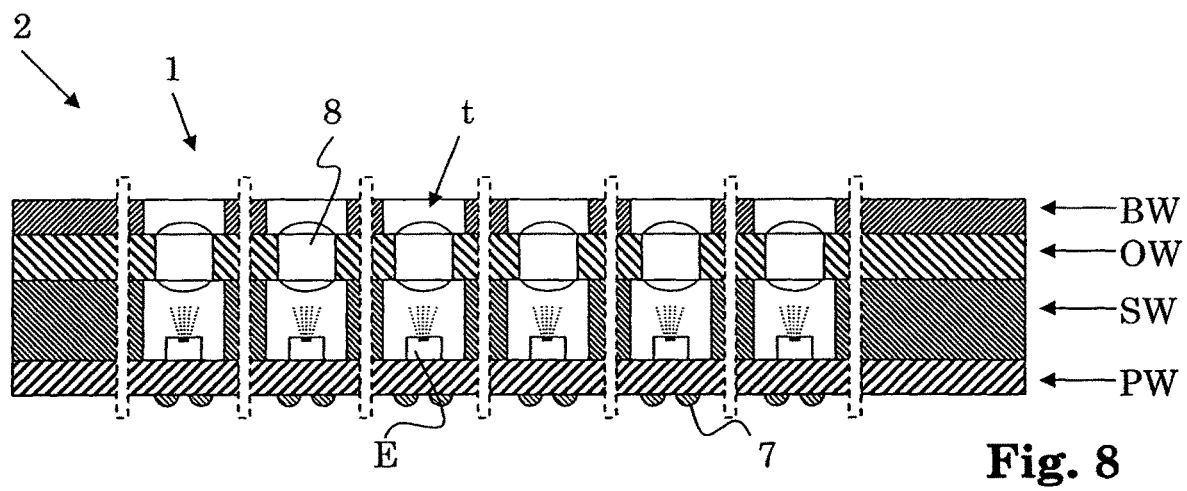
FIG. 8 a cross-sectional view of a wafer stack for manufacturing a multitude of modules of FIG. 5.

FIGS. 5 to 8 show, in the same manner as FIGS. 1 to 4, another device 10 and another opto-electronic module 1 comprised therein. Approximate positions of the lateral cross-sections of FIG. 2 are indicated in FIG. 5 by s1' to s5'.

The module 1 of the example of FIG. 5 comprises only one active optical component, namely light emission element E. It comprise a substrate member P on which light emission element E is mounted and a substrate member O comprising a transparent portion t comprising passive optical component 8 and two optional optical structures 5, 5' which are, e.g., lens elements, which may be diffractive ones or, as illustrated in FIG. 1, refractive ones. Between members P and O, a spacer member S is arranged. Member B is optional and functions as a baffle for light emitted from module 1. It comprises an opening 33 through which light can exit module 1. An opening 4 is laterally enclosed by spacer member S.

Module 1 is very compact and may find various applications, e.g., as a flash light and/or auxiliary light in photographic devices.

Further details (i.a. ways of manufacturing, materials, functions, arrangements and applications) are readily inferred from what has been explained in conjunction with FIGS. 1 to 4.

Figure 9:
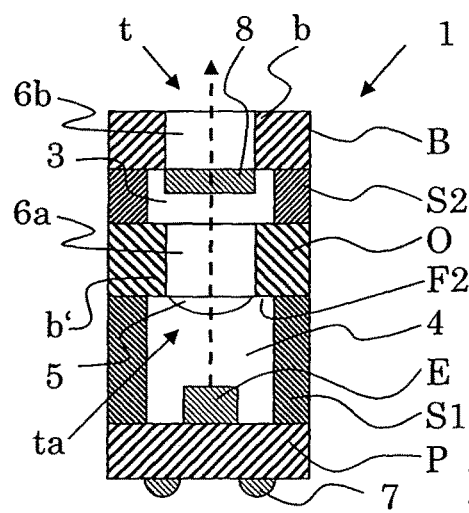
FIG. 9 a cross-sectional view of an opto-electronic module.

FIG. 9 illustrates a cross-sectional view of another opto-electronic module 1. This opto-electronic module 1 is similar to the modules 1 of FIGS. 1 and 5; details such as functions, constituents and reference symbols can be readily inferred from the corresponding descriptions. But the module 1 of FIG. 9 has two levels like the one of FIG. 1, because it has three substrate members P, O and B and two spacer members S1 and S2, but it has one channel and one active optical component, in particular one light emission element E only. Transparent portion to of member O comprises one coplanar transparent element 6a and attached thereto (at face F2 of member O) one lens element 5 laterally enclosed by blocking portion b'. In FIG. 9, passive optical component 8 is attached to transparent element 6b.

In any embodiment, it is generally possible to to provide zero, one or more optical structures or passive optical components in addition to passive optical component 8 having adjustable optical properties. And, depending on the kind of passive optical component 8, zero, one or two optical structures or passive optical components can be attached to passive optical component 8. Furthermore, in the example of FIG. 9 as well as in other embodiments (in particular where passive optical component 8 is comprised in a transparent portion t from where light originating from light emission element 8 exits the respective module 1), it is generally possible to add another member like the baffle member B in FIG. 5.

Figure 10:
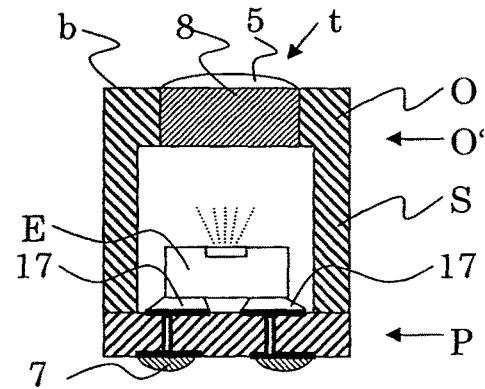
FIG. 10 a cross-sectional view of an opto-electronic module.

FIG. 10 illustrates a cross-sectional view of another opto-electronic module 1. Again, the way of illustration is like in FIGS. 1, 5 and 9, and the details such as functions, constituents and reference symbols are again readily inferred from there. FIG. 10 illustrates the case where a "combined member" O' is provided. Also this member can be manufactured well using replication, and it combines the functionalities of substrate member O and spacer member S. FIG. 10 further illustrates one of the various possibilities of mechanically and electrically contacting light emission element E, namely bonding using an electrically conductive glue, cf. reference symbol 17. And, FIG. 10 illustrates a way of attaching an optical structure 5 such as a lens element (diffractive and/or refractive) to passive optical component 8.

Furthermore, it is illustrated in FIG. 10, how electrical contacts between light emission member E and the outside of module 1 (via, e.g., the illustrated solder balls 7) can be accomplished. It is possible to provide, like in a standard printed circuit board, electrical contacts across substrate member P, and at both ends of corresponding through-holes, contact pads can be provided.

Figure 11:
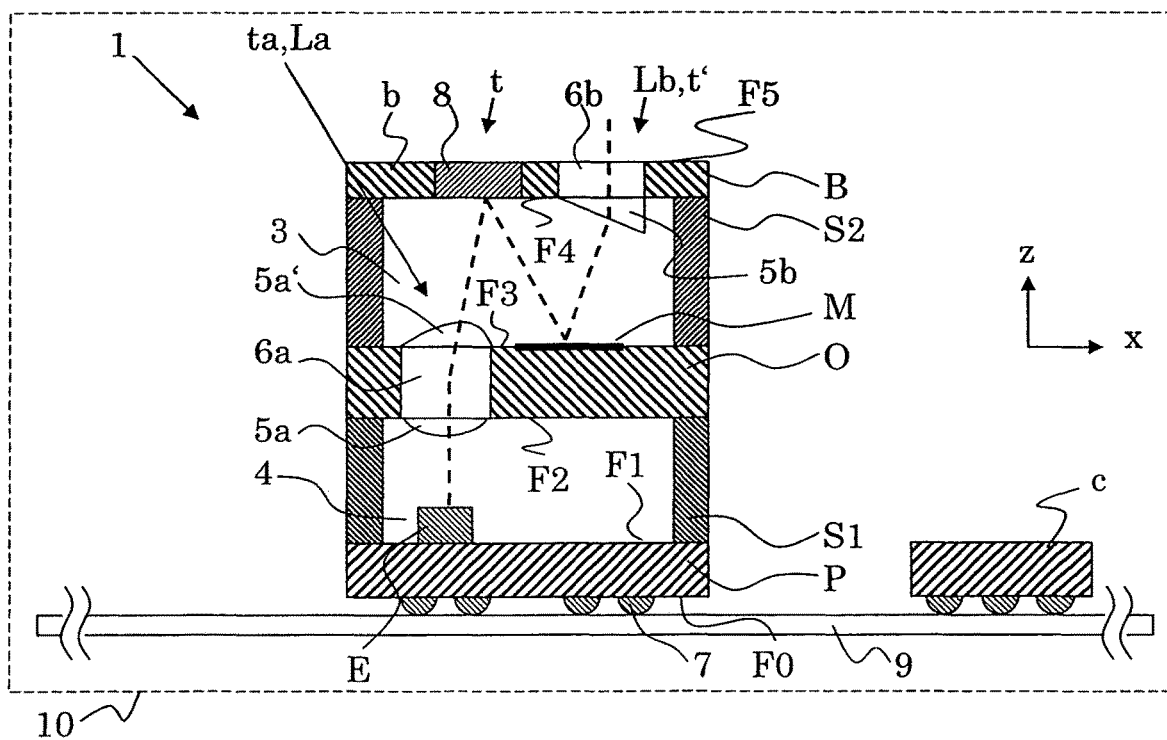
FIG. 11 a cross-sectional view of an opto-electronic module.

FIG. 11 illustrates a cross-sectional view of yet another opto-electronic module 1. Again, the way of illustration is like in FIGS. 1, 5, 9 and 10, and the details such as functions, constituents and reference symbols are again readily inferred from there. FIG. 11 illustrates a module 1 with a more complicated light path inside module 1 and is an example for the use of a reflective passive optical component 8. Substrate member B comprises two transparent portions t and t'; t comprising reflective passive optical component 8, t' comprising transparent 6b and an optical structure 5b embodied as a prism. Blocking portion b laterally encloses them both. Substrate member O comprises transparent portion to comprising passive optical component La, and a mirror M is provided on face F3 of member O.

Light emitted from light emission element E passes through passive optical component La, e.g., for beam forming and/or collimating and/or redirecting. Then, the light is reflected at passive optical component 8 in an adjustable manner, e.g., for creating a selectable light intensity distribution. Then, the light is reflected at mirror M (which might be curved instead of planar), and it then exits module 1 through passive optical component Lb, e.g., for redirecting (by prism 5b).

Mirror M can, e.g., be manufactured, on wafer level, by selectively coating a wafer comprising a multitude of members O, or it can be placed there by pick and place.

Figure 12:
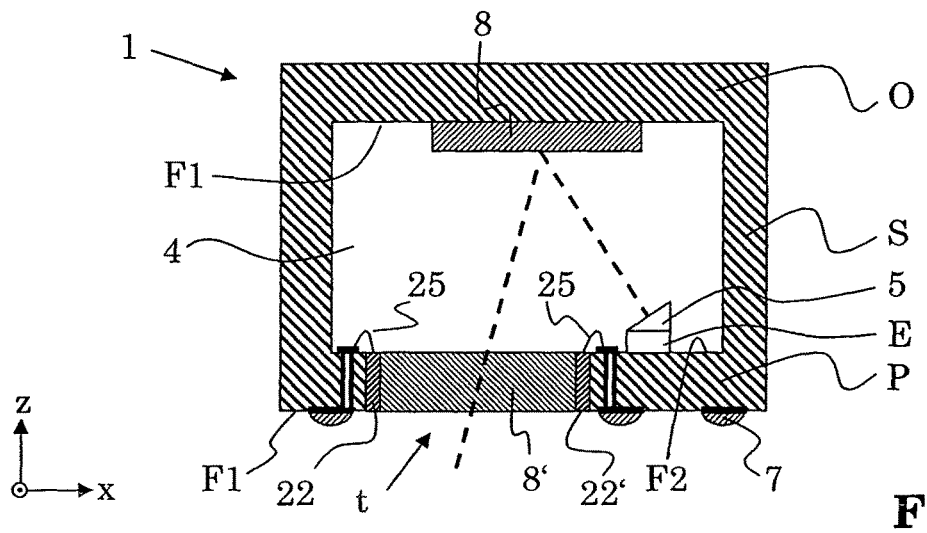
FIG. 12 a cross-sectional view of an opto-electronic module.

FIG. 12 illustrates a cross-sectional view of an opto-electronic module 1. Again, the way of illustration is like in FIGS. 1, 5, 9, 10 and 11, and the details such as functions, constituents and reference symbols are again readily inferred from there. FIG. 12 illustrates a module 1 with two passive optical components 8, 8' each having adjustable optical properties. For one of them (8'), it is also illustrated how electrical contacts may be accomplished between passive optical component 8 and the outside of module 1 (via, e.g., the illustrated solder balls 7). E.g., wirebonds 25 can be provided outside of module 1 (at face F1) or, as illustrated, inside module 1 (at face F2), which provide an electrical connection between electrodes 22, 22' of passive optical component 8' to member P (which again can be embodied as an interposer or a printed circuit board).

For electrically contacting a passive optical component (such as passive optical component 8 at member O in FIG. 12) with adjustable optical properties which is not arranged at a member which provides (like members P) electrical contacts for electrically contacting the module 1 from the outside (e.g., via contact pads and/or solder balls 7), other provisions can be taken. E.g., strip conductors may be provided on sides of substrate members and spacer members, which may be on an inner face and/or on an outer face of module 1.

Light emission element E is provided with a passive optical component 5 such as a prism. Passive optical component 8 is a reflective one, and passive optical component 8' is a transmissive one.

Members P, S and O are in FIG. 12 not illustrated as separate units, because, as has been explained before, spacer member S can be comprised in any of members O and P or be distinct from them.

Figure 13:
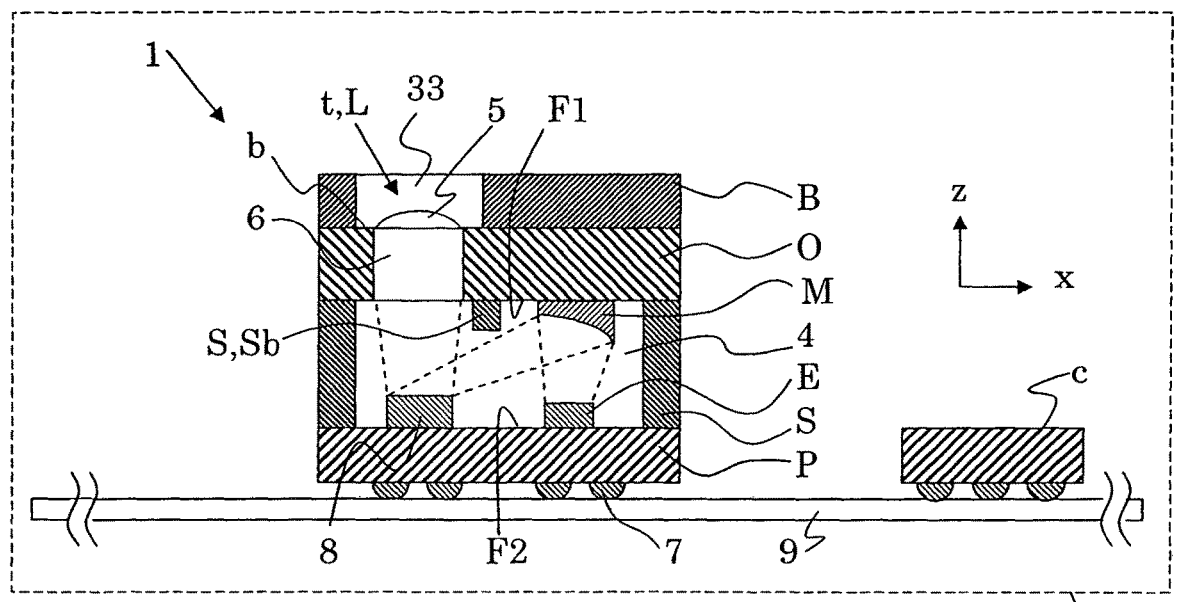
FIG. 13 a cross-sectional view of an opto-electronic module.

FIG. 13 illustrates a cross-sectional view of an opto-electronic module 1. Again, the way of illustration is like in FIGS. 1, 5, 9, 10, 11 and 12, and the details such as functions, constituents and reference symbols are again readily inferred from there. Although a single-level module, a rather elaborated optical path is realized in this embodiment. Light emitted from light emission element E is focussed and redirected by curved mirror M. Then, it is reflected by passive optical component 8 in an adjustable manner and finally is emitted from module 1 having passed through passive optical component L and opening 33 in optional (baffle) member B. Again, a device 10 comprising module 1 may comprise a printed circuit board 9 on which module 1 and, possibly, also an integrated circuit c is mounted, wherein integrated circuit c may provide control signals such as electric voltages for controlling passive optical component 8 and/or light emission element E. Electrical contacts from passive optical component 8 to member P may be accomplished, e.g., in any well-known surface mount technology (SMT).

Figure 14:
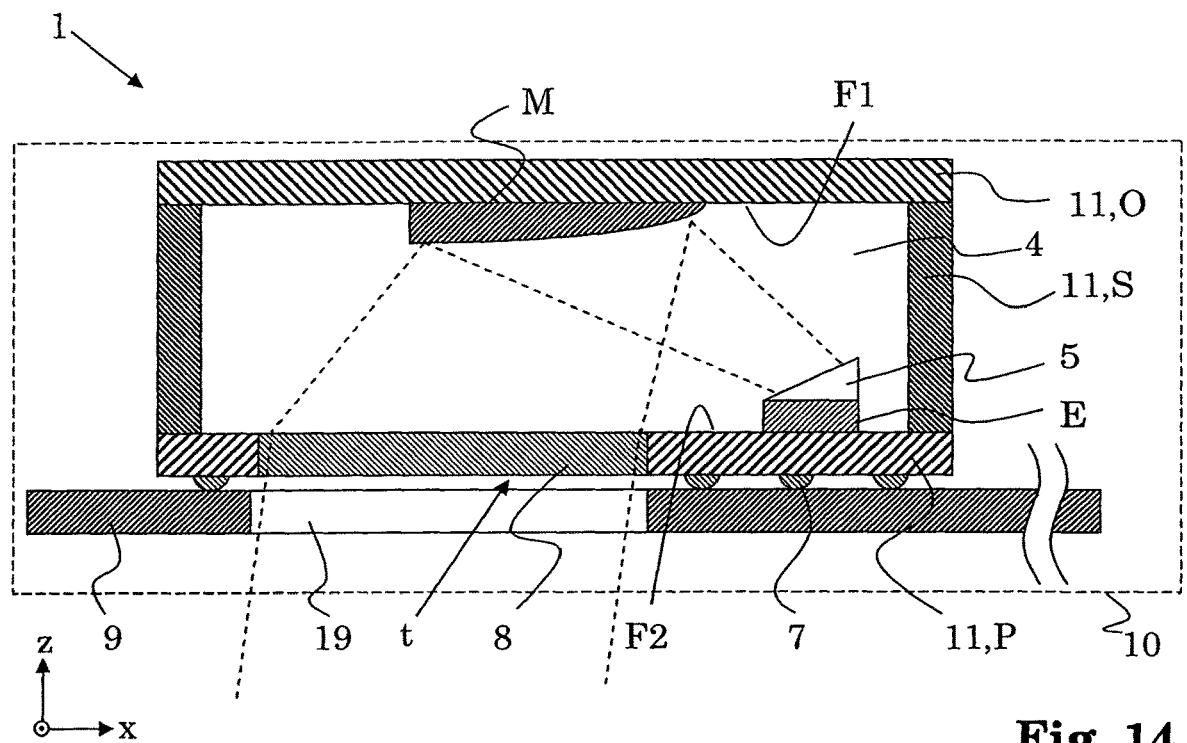
FIG. 14 a cross-sectional view of an opto-electronic module.

FIG. 14 illustrates a cross-sectional view of an opto-electronic module 1. Again, the way of illustration is like in FIGS. 1, 5, 9, 10, 11, 12 and 13, and the details such as functions, constituents and reference symbols are again readily inferred from there. In module 1 of FIG. 14, light exits the module through the same member (P) at which module 1 is electrically contacted. For that reason, in a printed circuit board 9 of a device 10 on which module 1 is mounted comprises an opening or through-hole 19. Passive optical component 8 is transmissive, and a curved mirror M as well as a prism 5 are provided for redirecting light emitted from light emission member E to properly illuminating passive optical component 8. Furthermore, it is indicated in FIG. 14, which constituents contribute to (in fact, make up for) a housing 11 of module 1.

In the following, various ways of realizing or embodying passive optical components 8 having adjustable optical properties shall be explained by explaining the basic underlying principles and setups and very schematically illustrating these.

Figure 15:
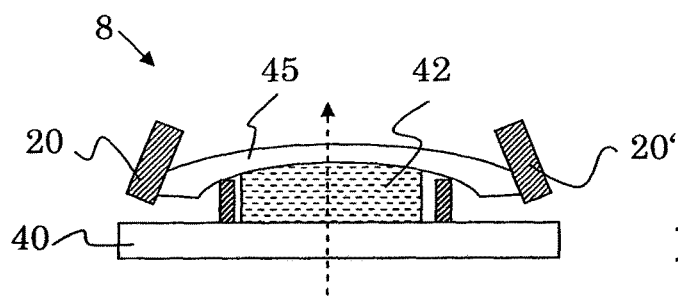
FIG. 15 an illustration of a passive optical component comprising a deformable lens.

FIG. 15 is an illustration in a cross-sectional view of a passive optical component 8 comprising a deformable lens. On a transparent substrate 40, a deformable transparent material 42 is present which is adjusted to and arranged between said substrate 40 and a transparent deformable plate 45, e.g., a glass membrane. Actuators 20, 20' such as piezo-electric actuators are arranged such that they can apply forces to plate 45 when a suitable voltage is applied to the actuators 20, 20'. Electrodes of the actuators are not separately illustrated. This way, it can be achieved that a lens of variable, adjustable curvature is realized. Deformable lenses are commercially available and described at, e.g., www.polight.com.

Figure 16:
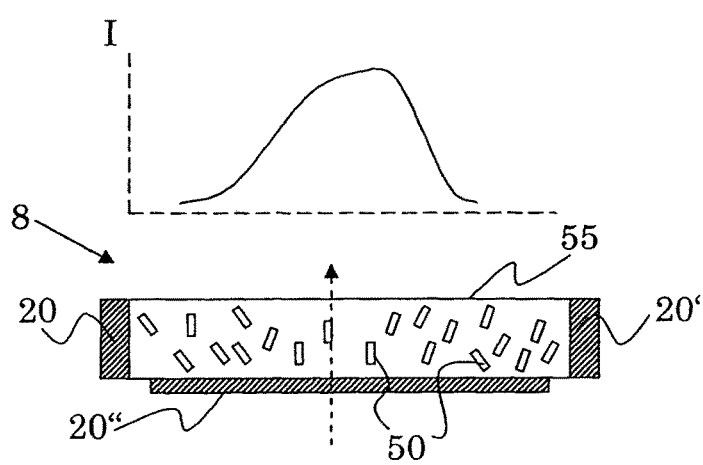
FIG. 16 an illustration of a passive optical component comprising liquid crystals.

FIG. 16 is a very simplified illustration in a cross-sectional view of a passive optical component 8 comprising liquid crystals 50. The crystals 50 are comprised in a housing 55 at which electrodes are provided as actuators 20, 20', 20". Electrode 20" is transparent. By applying suitable voltages to the electrodes, the crystals can be arranged in such a way that light passing through housing 55 ends up having an intensity distribution which is precisely adjustable (by said voltages). In FIG. 16 above housing 55, an exemplary intensity distribution is sketched. The use of a liquid crystal display for attenuating light in photographic applications is described in more detail in "Spatially Adaptive Photographic Flash" by Rolf Adelsberger et al., ETH Zurich, Dept. of Computer Science, Technical Report No. 612, 2008.

Figure 17:
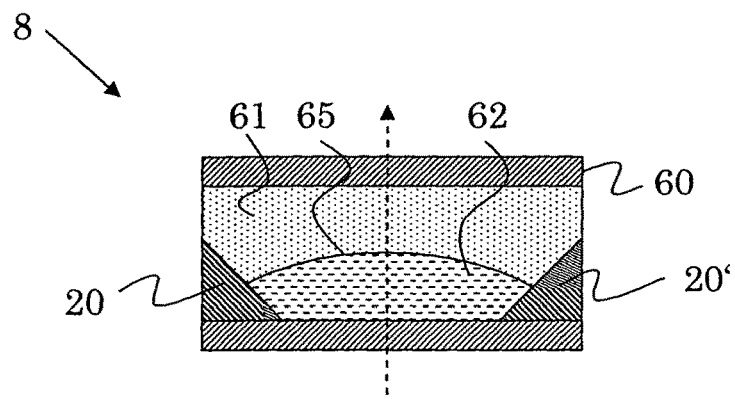
FIG. 17 an illustration of a passive optical component comprising a variable lens formed by an interface between two fluids.

FIG. 17 is an illustration in a cross-sectional view of a passive optical component 8 comprising a variable lens formed by an interface 65 between two fluids 61, 62. The non-mixing fluids 61, 62 are comprised in a housing 65 comprising electrode as actuators 20, 20'. By applying suitable voltages to the electrodes, the shape of the interface 65 and therewith the optical characteristics experienced by light traversing it can be changed in a selectable manner. Various lens shapes can be created this way, making use of the electrowetting principle. Such liquid lenses are commercially available and described at, e.g., www.varioptic.com.

Figure 18:
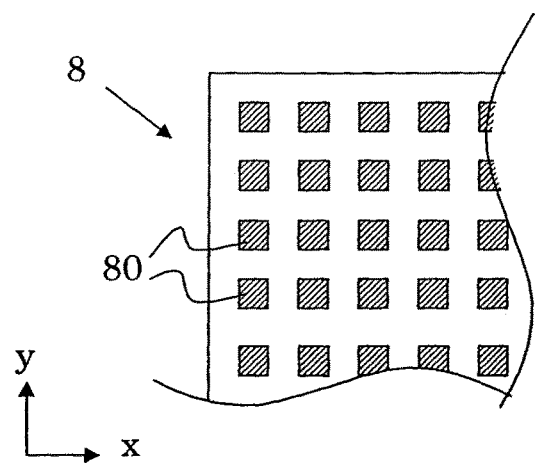
FIG. 18 an illustration of a passive optical component comprising a micro-mirror array.

FIG. 18 is an illustration of a passive optical component 8 comprising a micro-mirror array. A detail of a micro-mirror array is shown (in a strongly schematized manner) in a top view (onto a lateral plane). Micro-mirror arrays are well known and commercially available from various sources. They comprise a multitude of miniscule mirrors 80 which usually are individually controllable at least to be tilted from a first to a second position. Thus, creating selectable intensity distributions by means of a micro-mirror array is readily accomplished. Basically, suitable control signals have to be applied in order to move each micro-mirror in a desired position.

Figure 19:
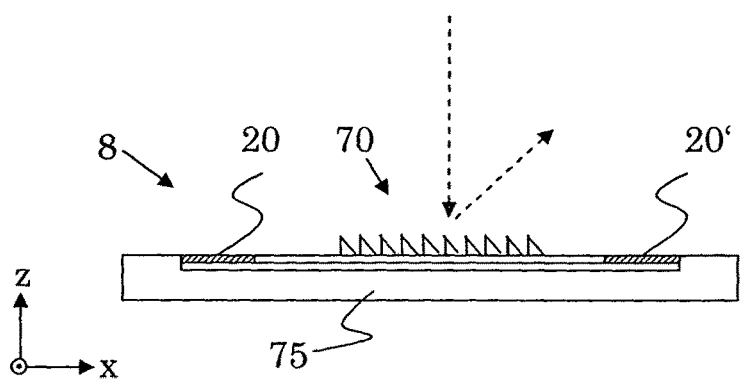
FIG. 19 an illustration of a passive optical component comprising a deformable diffraction grating.

FIG. 19 is an illustration of a passive optical component 8 comprising a (micro-machined and/or silicon-based) deformable diffraction grating 70, in a cross-sectional view. On a substrate 75 such as a plate of silicon, a diffraction grating 75 is provided at opposite ends thereof, actuator 20, 20' are provided in form of comb actuators. Comb actuators are well known in the field of micro-electromechanical systems (MEMS) and work based on electrostatic forces. Applying suitable voltages to the actuators allows to stretch or shrink the diffraction grating 75 in a lateral direction (in FIG. 19: along the x coordinate). Accordingly, the lattice constant of the diffraction grating 75 can be changed this way. This can allow to adjustably modify light reflected by diffraction grating 75; e.g., an angle under which light incident under an angle of incidence is reflected can be adjusted this way and/or a color distribution of reflected light can be adjusted.

Diffraction gratings with adjustable lattice constant have been described in various publications by collaborators of the Centre Suisse d'Electronique et de Microtechnique SA (CSEM).

Reflective membranes can also be suitable passive optical components with adjustable optical properties. Deformations may be accomplished electrically or mechanically, in particular micro-mechanically.

Deformable mirrors, in particular MEMS deformable mirrors are available, cf., e.g., http://www.bostonmicromachines.com or http://www.okotech.com or http://www.iri-sao.com.

Optical elements, in particular adjustable lenses, on basis of electrostriction and/or electroactive polymers are known. They are described, e.g., cf. www.optotune.com.

FIG. 20 is an illustration of an effect of changed optical properties of a passive optical component in an opto-electronic module 1. The effect illustrated is that a main emission direction or a central emission direction is changed. The dotted line is aligned along a vertical direction (with respect to opto-electronic module 1). Light is emitted from transparent portion t. For light emitted like sketched by the solid lines, a different exit angle applies than for light emitted like sketched by the dashed lines. The approximate width of a cone of light emission may, as sketched in FIG. 20, remain substantially constant. But it is also possible to change (alternatively or in addition) said width.

FIG. 21 illustrates the effect of changed optical properties of a passive optical component in an opto-electronic module 1 in case of substantially unchanged (main or central) emission direction, namely along a vertical direction, but with changed width of a cone of light emission. In case of light illustrated by the solid lines, the emitted light intensity is more closely focused (in angle and in space) than in case of light illustrated by the dashed lines.

Changes from light emission as illustrated by the dashed lines to light emission as illustrated by the solid lines (and vice versa) can be accomplished using an opto-electronic module comprising, as described, adjustable optical properties.

FIGS. 22 to 24 are illustrations of effects of changed optical properties of a passive optical component in an opto-electronic module 1. The horizontal axis indicates the exit angle of light exiting module 1. Zero degrees means vertical emission (along the z axis). The intensity sketches of FIG. 22 versus FIG. 23 illustrate the effect illustrated in FIG.

20. The intensity sketches of FIG. 23 versus FIG. 24 illustrate the effect illustrated in FIG. 21, but for not-vertical light emission.

FIG. 25 is an illustration of an effect of changed optical properties of a passive optical component in an opto-electronic module 1. In the upper and lower parts of FIG. 25, intensity distributions are illustrated by iso-intensity lines. The intensity distributions might be detectable, e.g., when detecting, in a lateral (or another) plane distant from module 1, the intensity of light emitted from module 1, e.g., using an image detector. In the upper panel, a rather flat intensity distribution is illustrated which is rather symmetric and centered. Making suitable adjustments to a passive optical component 8 in module 1, the intensity distribution of light emitted from module 1 may look like illustrated in the lower part of FIG. 25. In that case, light is emitted with a rather steep and not-centered intensity distribution. The directions in the drawing plane in FIG. 25 may be assigned to lateral room coordinates or to lateral components of exit angles.

Effects as illustrated in FIGS. 20 to 25 are readily accomplished with various of the described passive optical components 8.

It is also possible to produce light patterns using opto-electronic modules of the described kind. These are readily accomplished using a micro-mirror array (cf. FIG. 18) and can be achievable using liquid crystals (cf. FIG. 16). Such patterns may be used e.g., for determining distances or brightnesses, e.g., in photography. Such patterns usually have steep contrasts.

FIG. 26 is an illustration of a pattern projected by an opto-electronic module comprising a passive optical component with adjustable optical properties, e.g., a micro-mirror array. The pattern is a line pattern. The dark lines indicate high intensity. (The directions in the drawing plane in FIG. 26 may be assigned to lateral components of exit angles or to lateral room coordinates.)

FIG. 27 is an illustration of an intensity distribution along the dotted line through the pattern illustrated in FIG. 26. several steep peaks are clearly visible.

Various line patterns, not only grid-like ones, may be accomplished.

FIG. 28 is an illustration of another pattern projected by an opto-electronic module comprising a passive optical component with adjustable optical properties. In this case, a checkerboard pattern is projected. (The directions in the drawing plane in FIG. 28 may be assigned to lateral components of exit angles or to lateral room coordinates.)

Any of the disclosed ways of realising passive optical component 8 (having adjustable optical properties) may be applied in any embodiment, perhaps except where an attachment of a passive optical component like an optical structure to passive optical component 8 is unsuitable such as on a deformable surface of a deformable lens (cf. FIG. 15) and except that the kind of passive optical component 8 (reflective or transmissive) has to match the configuration of the module.

Possible applications for modules 1 are disclosed in section "Summary of the Invention" and also elsewhere, e.g., described for particular embodiments in section "Detailed Description of the Invention". Any of the described embodiments can find any of these applications; even though embodiments with a micro-mirror array (cf. FIG. 18) may be more suitable for projecting patterns onto a scene than other embodiments.

A particularly interesting application of the described opto-electronic modules is in photography. The modules can be particularly suitable as flash light modules. Instead of providing always the same light intensity distribution (in space), the described modules allow to select particularly suitable light intensity distributions, e.g., in dependence of properties of a scene to be imaged. E.g., particularly high light intensities can be provided for directions in which the scene is particularly dark and/or in which objects in the scene are particularly far distant from the module. It is even possible to use the module during determining distances or brightnesses or reflectivities and, also, during flashing (in dependence of determined values). For this, it can be suitable to have two light emission elements comprised in a module 1 (cf. FIG. 1), e.g., an infrared emitter and a white-light emitter, but it is also possible to accomplish this using a single light emission element only.

The invention claimed is:

1. A light-emitting opto-electronic module operable to emit light with a variable intensity distribution representing a light pattern having at least two light intensity peaks, the light-emitting opto-electronic module comprising:
   a first substrate member;
   a light emission element arranged on the first substrate member;
   a second substrate member comprising a solid transparent portion through which light emitted by the light emission element can pass;
   a first spacer member separating the first and second substrate members from one another, wherein the first spacer member comprises at least one opening to accommodate the light emission element;
   a third substrate member comprising a non-transparent blocking portion and a first passive optical component, the non-transparent blocking portion laterally enclosing the first passive optical component; and
   a second spacer member separating the second and third substrate members from one another such that the first, second and third substrate members are stacked one over the other;
   wherein said first passive optical component has adjustable optical properties and is disposed so as to intersect a path of light emitted by the light emission element after the light passes through the solid transparent portion of the second substrate member, so as to effect a variation of the intensity distribution, representing a light pattern having at least two light intensity peaks, by adjusting the adjustable optical properties,
   wherein the opto-electronic module is operable to project the light having the light pattern, after interaction with the first passive optical component, through a transparent portion or opening in the third substrate member to an exterior of the opto-electronic module, and
   wherein for light incident on the passive optical component in different locations and/or at different angles of incidence, the adjustable optical properties are differently adjustable to redirect projected light to different exit directions from the opto-electronic module.

2. A wafer stack comprising a multitude of opto-electronic modules according to claim 1, the wafer stack comprising:
   a first substrate wafer comprising a multitude of said first substrate members;
   a second substrate wafer comprising a multitude of said second substrate members;
   a first spacer wafer comprising a multitude of said first spacer members;
   a multitude of said light emission elements; and
   a multitude of said first passive optical components;
   wherein at least one of said first or second substrate wafers comprises a multitude of transparent portions.

3. A device comprising an opto-electronic module according to claim 1, wherein the device is at least one of:
a photographic device;
a digital camera;
a video device;
a camcoder;
a communication device;
a smart phone;
a hand-held device;
a mobile computing device;
attachment to an electronic device;
an attachment to a mobile communication device;
a flash unit;
a flash unit, for photographic applications;
a sensor unit; or
a sensor unit for photographic applications.

4. The module according to claim 1 wherein along a straight line through said intensity distribution, said intensity distribution exhibits an intensity profile exhibiting at least two local intensity maxima which are separated from each other by a local intensity minimum.

5. The module according to claim 4 wherein the intensity distribution exhibits at the local intensity minimum an intensity value which amounts to is at most 10% of an intensity value present at any one of the local intensity maxima.

6. The module according to claim 1 wherein the adjustable optical properties comprise an adjustable transmittivity.

7. The module according to claim 1 wherein the adjustable optical properties comprise an adjustable absorption.

8. The module according to claim 1 wherein the adjustable optical properties comprise an adjustable reflectivity.

9. The module according to claim 1 wherein the adjustable optical properties comprise adjustable refractive properties.

10. The module according to claim 1 wherein the first passive optical component has an active area, and wherein the first passive optical component has a transmissivity which is variable selectively across the active area.

11. The module according to claim 1 wherein the first passive optical component has an active area, and wherein the first passive optical component has an absorption which is variable selectively across the active area.

12. The module according to claim 1 wherein the first passive optical component has an active area, and wherein the first passive optical component has a reflectivity which is variable selectively across the active area.

13. The module according to claim 1 wherein the first passive optical component has an active area, and wherein the adjustable optical properties comprise a reflectivity which is adjustable to different values in different regions of the active area.

14. The module according to claim 1 wherein the first passive optical component comprises a mirror of adjustably different reflectivity in different locations across the mirror.

15. The module according to claim 1 wherein the first passive optical has a surface, and a shape of the surface can be selectively varied to effect the adjustable optical properties.

16. The module according to claim 15 wherein the surface is a reflective surface.

17. The module according to claim 15 wherein the surface is a transmissive surface.

18. The module according to claim 1 wherein first substrate member has a first side and opposite the first side a second side, and wherein the light emission element is attached and electrically connected to the first side and, via the first substrate member, electrically connected to the second side.

19. The module according to claim 18 wherein the light emission element is electrically connected to an outside of the module via the first substrate member.

20. The module according to claim 1 wherein the first substrate member is a printed circuit board or a printed circuit board assembly.

21. The module according to claim 1 wherein:
outer bounds of a vertical silhouette of the module; and
outer bounds of a vertical silhouette of the first substrate member; and
outer bounds of a vertical silhouette of the second substrate member; and
outer bounds of a vertical silhouette of the first spacer member;
each describes a substantially rectangular shape.

22. The module according to claim 21 wherein the substantially rectangular shape is substantially identical for:
the outer bounds of a vertical silhouette of the module; and
the outer bounds of a vertical silhouette of the first substrate member; and
the outer bounds of a vertical silhouette of the second substrate member; and
the outer bounds of a vertical silhouette of the first spacer member.

23. The module according to claim 1 wherein the optical properties are adjustable by rearranging at least one constituent of the first passive optical component.

24. The module according to claim 1 wherein the optical properties are adjustable by rearranging a multitude of constituents of the first passive optical component.

25. The module according to claim 1 wherein the first passive optical component comprises a multitude of micro-mirrors, and said optical properties are adjustable by rearranging said multitude of micro-mirrors.

26. The module according to claim 1 comprising a second passive optical component, wherein the second passive optical component is a lens or lens element.

27. The module according to claim 26, wherein the lens or lens element is coupled to the solid transparent portion.

28. The module according to claim 1 wherein the first passive optical component comprises an actuator.

29. The module according to claim 1 wherein the first passive optical component comprises a housing in which at least two different fluids are present, the two different fluids being in direct contact with one another, forming with each other an interface of variable shape, and functioning as a lens of variable shape.

30. The module according to claim 1 wherein the first passive optical component comprises a housing in which liquid crystals are present and at least one electrode, the passive optical component being arranged to allow adjustment of an intensity distribution of light, originating from the light emission element and exiting the module, by adjusting the adjustable optical properties by application of a voltage to the at least one electrode for rearranging the liquid crystals.

31. The module according to claim 1, wherein the light pattern comprises a checkboard pattern.

32. The module according to claim 1, wherein the light pattern comprises a plurality of repetitive shapes.

33. The module according to claim 32, wherein the plurality of repetitive shapes comprises a plurality of lines.

34. The module according to claim 33, wherein at least one of the plurality of lines intersect one another.

35. The module according to claim 32, wherein the plurality of repetitive shapes comprises a plurality of polygons.

* * * * *